(12) United States Patent
Zhao et al.

(10) Patent No.: US 6,496,950 B1
(45) Date of Patent: Dec. 17, 2002

(54) TESTING CONTENT ADDRESSABLE STATIC MEMORIES

(75) Inventors: Jun Zhao, Whitehall, PA (US); Mukesh Puri, Fremont, CA (US); V. Swamy Irrinki, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/372,275

(22) Filed: Aug. 11, 1999

(51) Int. Cl.$^7$ ............................................... G11C 29/00
(52) U.S. Cl. ...................................... 714/718; 714/733
(58) Field of Search .................................. 714/920, 719, 714/7, 733, 743, 730, 718; 365/201

(56) References Cited

U.S. PATENT DOCUMENTS

| | | | | |
|---|---|---|---|---|
| 5,107,501 A | * | 4/1992 | Zorian | 714/720 |
| 5,535,164 A | * | 7/1996 | Adams et al. | 365/201 |
| 5,761,110 A | | 6/1998 | Irrinki et al. | 365/100 |
| 5,784,328 A | | 7/1998 | Irrinki et al. | 365/222 |
| 5,808,932 A | | 9/1998 | Irrinki et al. | 365/150 |
| 5,822,228 A | | 10/1998 | Irrinki et al. | 364/580 |
| 5,847,990 A | | 12/1998 | Irrinki et al. | 365/154 |
| 5,867,423 A | | 2/1999 | Kapoor et al. | 365/168 |
| 5,996,097 A | * | 11/1999 | Evans et al. | 714/719 |
| 6,067,262 A | | 5/2000 | Irrinki et al. | 365/201 |
| 6,085,334 A | * | 7/2000 | Giles et al. | 714/7 |
| 6,286,116 B1 | * | 9/2001 | Bhavsar | 714/720 |

OTHER PUBLICATIONS

*Design And Algorithms For Parallel Testing Of Random Access And Content Addressable Memories,* P. Mazumder et al., 24$^{th}$ ACM/IEEE Design Automation Conference © 1987, Paper 36.2, pp. 688–694.

*Built–In Self–Test For Multi–Port RAMs,* Yuejian Wu et al., 6 pages.

*A 5Gb/s 9–Port Application Specific SRAM with Built–In Self Test,* Steven W. Wood et al., pp. 68–73.

*Dual Port Static RAM Testing,* Manuel J. Raposa, 1988 International Test Conference, © 1988 IEEE, Paper 20.3, pp. 362–368.

*Associative Processors And Memories: A Survey,* Karl E. Grosspletsch, IEEE Micro, Jun. 1992, IEEE Publication No. 0272–1732/92/0600–0012, pp. 12–19.

*Using March Tests To Test SRAMs,* Ad J. Van De Goor, IEEE Design & Test Of Computers, IEEE Publication No. 0740–7475/93/0300–0008, pp. 8–14.

*Modem/Radio IC Architectures For ISM Band Wireless Applications,* Yanpen Guo et al., IEEE Transactions On Consumer Electronics, vol. 39, No. 2, May 1993, IEEE Publication No. 0098 3063/93, pp. 100–106.

*A High Speed Embedded Cache Design With Non–Intrusive BIST,* Steve Kornachuk et al., 0–8186–62345–X/94, pp. 40–45.

(List continued on next page.)

Primary Examiner—David Ton
(74) Attorney, Agent, or Firm—Conley, Rose & Tayon

(57) ABSTRACT

A CAM testing procedure detects storage logic faults, comparison logic faults, and faults caused by interactions between the storage and comparison logic for both single port and dual port CAM's. To uncover faults in the storage logic, a series of read and write operations are performed, either using a standard test sequence, such as the March C algorithm, or any other desired test sequence. The CAM test, however, intermixes comparison operations with the read and write operations to uncover faults in the comparison logic. For dual port memories, the test sequence comprises executing comparison operations concurrently with the read and/or write operations, thus revealing faults between the storage and comparison logic. For single port memories, the test sequence comprises performing a comparison operation following the read/write operations at each address, immediately verifying the comparison logic at each address.

12 Claims, 10 Drawing Sheets

OTHER PUBLICATIONS

*On Fault Modeling And Testing Of Content–Addressable Memories,* W. K. Al–Assadi et al., IEEE Publication No. 0–8186–6245–X/94, pp. 78–83.

*Fault Models And Tests For Ring Address Type FIFO,* Ad J. van de Goor et al., IEEE Publication No. 0–8186–5440–6/94, pp. 300–305.

*Testing Complex Couplings In Multiport Memories,* M. Nicolaidis et al., IEEE Transactions On Very Large Scale Integration (VLSI) Systems, vol. 3, No. 1, Mar. 1995, IEEE Publication No. 1063–8210/95, pp. 59–71.

*An Efficient Test Method For Embedded Multi–port RAM with BIST Circuitry,* T. Matsumura, IEEE Publication No. 0–8186–7102–5/95, pp. 62–67.

*Yield And Cost Estimation For A CAM–Based Parallel Processor,* W. B. Noghani et al., IEEE Publication No. 0–8186–7102–5/95, pp. 110–116.

*Functional Test For Shifting–Type FIFOs,* Ad J. van de Goor et al., IEEE Publication No. 1066–1409/95, pp. 133–138.

*March LR: A Test For Realistic Linked Faults,* A. J. van de Goor et al., 14$^{th}$ VLSI Test Symposium—1996, IEEE Publication No. 0–8186–7304–4/96, pp. 272–280.

*March U: A Test For Unlinked Memory Faults,* A. J. van de Goor et al., © IEE, 1997, IEE Proceedings online No. 19971147, 6 pages.

*Disturb Neighborhood Pattern Sensitive Fault,* A. J. van de Goor et al., IEEE Publication No. 0–8186–7810–0/97, pp. 37–45.

*An Analysis Of (Linked) Address Decoder Faults,* A. J. van de Goor et al., IEEE Publication No. 0–8186–8099–7/97, pp. 13–20.

*An Open Notation For Memory Tests,* Aad Offerman et al., IEEE Publication No. 0–8186–8099–7/97, pp. 71–78.

*False Write Through And Un–Restored Write Electrical Level Fault Models For SRAMs,* R. Dean Adams et al., IEEE Publication No. 0–8186–8099–7/97, pp. 27–32.

*Use Of Selective Precharge For Low–Power On The Match Lines Of Content–Addressable Memories,* Charles A. Zukowski et al., IEEE Publication No. 0–8186–8099–7/97, pp. 64–68.

*An Approach To Modeling And Testing Memories And Its Application To CAMs,* Piotr R. Sidorowicz et al., IEEE Publication No. 0–8186–8436–4/98, pp. 411–416.

*Fault Models And Tests For Two–Port Memories,* A. J. van de Goor et al., IEEE Publication No. 0–8186–8436–4/98, pp. 401–410.

* cited by examiner

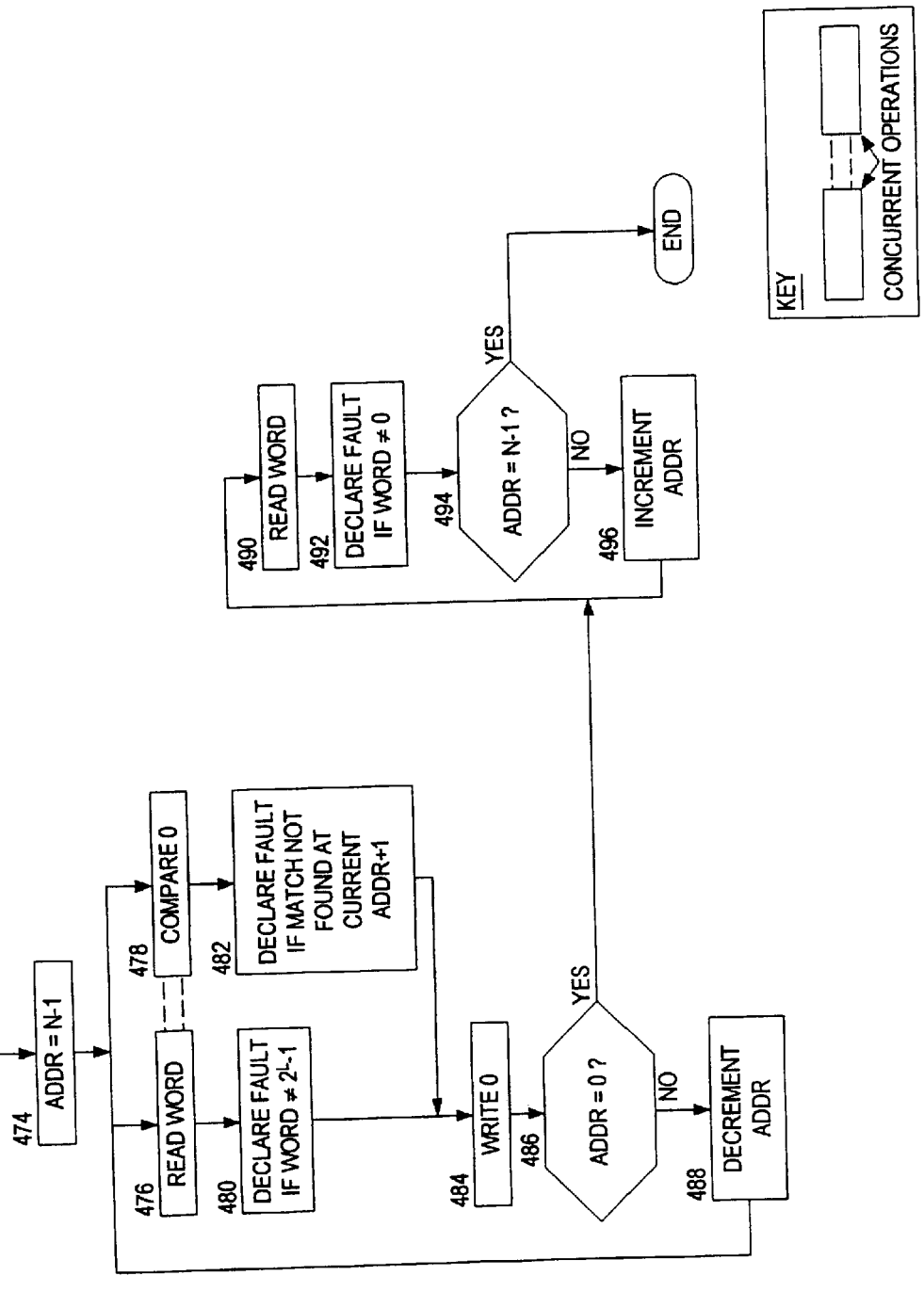

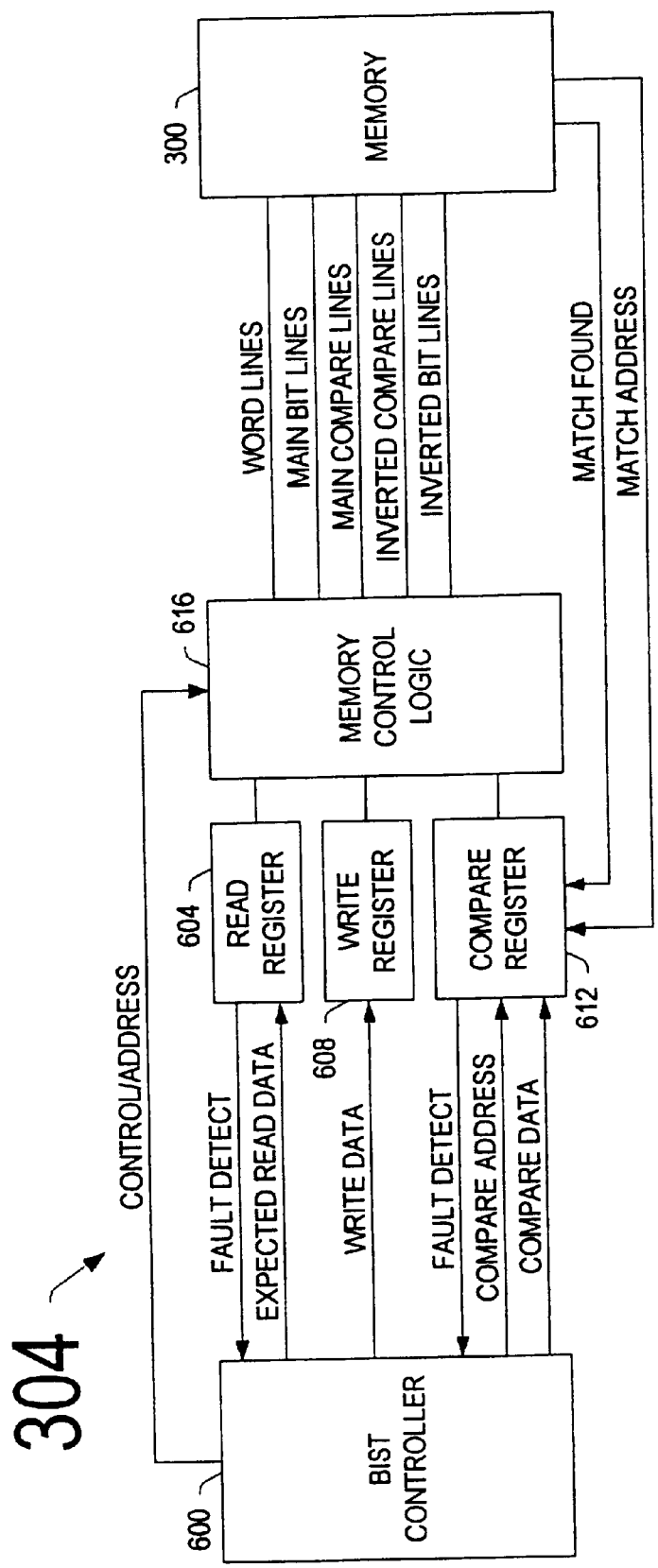

TESTING CONTENT ADDRESSABLE STATIC MEMORIES

CROSS-REFERENCE TO RELATED APPLICATIONS

This application is related to copending application Ser. No. 09/363,697, entitled "Detecting Interport Faults in Static Memories," filed on Jul. 28, 1999 by Jun Zhao, Mukesh Puri, and Venkateswara Swamy Irrinki, now pending, the disclosure of which is incorporated herein by reference.

STATEMENT REGARDING FEDERALLY SPONSORED RESEARCH OR DEVELOPMENT

Not applicable.

FIELD OF THE INVENTION

The present invention relates generally to methods for testing memory devices. More particularly, the present invention relates to methods for detecting faults in dual port and single port content addressable static memories.

BACKGROUND OF THE INVENTION

CAM Architecture

Fast, efficient testing is an important step in manufacturing memory chips, and the price paid for recent advances in semiconductor technology has been a lengthier and more complicated testing process. A common feature of some memory devices is the capability to quickly search for patterns stored among groups of memory cells. These types of memory devices are called content addressable memories (CAM's). Just like other memory devices, a CAM is arranged as an array of memory cells, each cell being capable of storing an electric charge. These charges can be manipulated to store and recall data through the use of special control circuitry in the memory. Each memory cell can store one of two values, depending on whether or not the cell holds a charge. The values 1 and 0 are typically used to represent the charged and uncharged states, respectively, although the reverse may be true. Because the cells can hold either of two possible values (i.e., a 1 or a 0), the cell data values are known as binary digits, or "bits."

In addition to a mechanism for storing data, content addressable memories cells each include a comparison circuit having a "compare" input signal and a "match" output signal. Typically, a group of cells share the same compare signal, while each cell outputs its own match signal. When a binary value (i.e., a 1 or 0) drives the compare input, each memory cell having the same value as the compare input activates (or "asserts") its match signal. This single-cell matching mechanism is useful for quickly finding data patterns among a plurality of cells in the memory device.

FIG. 1 illustrates a representative CAM 150, comprising an array of memory cells 100–103 and 110–113. As shown in FIG. 1, the cells are organized into 2 rows and 4 columns, although the cells may be organized into any number of rows and columns. Cells 100–103 represent the four columns of row 0, and cells 110–113 represent the four columns of row 1. Each cell includes a storage logic "S" and a comparison logic "C." The storage logic S holds the charge that identifies the data value. Each row of cells couples to a "word line" signal that activates the storage logic S of each cell for reading and writing data. The cells 100–103 on row 0, for instance, couple to word line $WL_0$, and the cells 110–113 on row 1 couple to word line $WL_1$.

The storage logic of each cell also couples to a "bit line" signal, which is shared with other cells in the same column. An inverted bit line also couples to each cell in the same column, carrying a 0 value if the main bit line has a 1 value or a 1 value if the main bit line carries a 0 value. Cells 100 and 110, for example, representing the first column of the array 150, couple to main bit line $BL_0$ and to inverted bit line $BL_0'$. Similarly the cells 101 and 111 in the second column couple to bit lines $BL_1$ and $BL_1'$, the cells 102 and 112 in the third column couple to bit line $BL_2$ and $BL_2'$, and the cells 103 and 113 in the final column couple to bit lines $BL_3$ and $BL_3'$. To read data from a particular cell, the word line coupled to that cell is asserted, causing that cell to dump data from the storage logic S onto the bit lines. To write a data value into a particular cell, the data value is placed onto the bit lines coupled to the cell. Activating the cell's word line then causes the cell to store the data value from the bit lines into the storage logic S.

The comparison logic C of each cell couples to the cell's storage logic S and to a pair of compare signals. Each column of cells shares a common pair of compare signals, including a main compare line and an inverted compare line. Cells 100 and 110, for example, couple to main compare line $CL_0$ and inverted compare line $CL_0'$, and cells 101 and 111 share the main compare line $CL_1$ and the inverted compare line $CL_1'$. Similarly, the storage logic of cells 102 and 112 receive main compare line $CL_2$ and inverted compare line $CL_2'$, while cells 103 and 113 receive main compare line $CL_3$ and inverted compare line $CL_3'$. In each cell, the comparison logic C generates a match signal based on the value stored in the cell and on the value of the compare signals. As illustrated in FIG. 1, the match signals on row 0 are $ML_{00}$ (cell 100), $ML_{01}$ (cell 101), $ML_{02}$ (cell 102), and $ML_{03}$ (cell 103). Similarly, the match signals on row 1 are $ML_{10}$ (cell 110), $ML_{11}$ (cell 111), $ML_{12}$ (cell 112), and $ML_{13}$ (cell 113). The architecture of CAM 150 is known as a dual port configuration, since the main bit lines are separate from the main compare lines. In a type of configuration known as single port, one signal line functions as both the main bit line and the main compare line, and another signal line functions as the inverted bit line and inverted compare line for each cell.

Memory cells usually are accessed in groups called "words." Memory words comprise at least two contiguous cells on the same row and share a common word line. For each word, an AND gate 125 may couple together match lines belonging to the cells in that word, to form a unified representation of the match line values. The memory array 150 in FIG. 1, for instance, is constructed using four-bit words, including a first word consisting of the cells 100–103 on row 0, and a second word consisting of the cells 110–113 on row 1. An AND gate 125A receives the match lines $ML_{00}$, $ML_{01}$, $ML_{02}$, and $ML_{03}$ belonging to cells 100–103. Similarly, an AND gate 125B receives the match lines $ML_{10}$, $ML_{11}$, $ML_{12}$, and $ML_{13}$ belonging to cells 110–113. Each AND gate 125 generates a word match signal that is asserted if each of the received match lines is asserted. AND gate 125A, for example, asserts the word match 0 signal if each of the match signals $ML_{00}$, $ML_{01}$, $ML_{02}$, and $ML_{03}$ is asserted, and the AND gate 125B asserts the word match 1 signal if each of the match lines $ML_{10}$, $ML_{11}$, $ML_{12}$, and $ML_{13}$ is asserted.

Using the compare and match lines, the CAM array 150 is capable of indicating which data words contain a certain pattern. First, the CAM 150 receives the data pattern through the compare lines. The compare lines carry the pattern to be matched, and the inverted compare lines carry the complement of the pattern to be matched. If the value of a cell matches the value on the associated main compare line, then that cell asserts its match line. If the value of a cell matches the value on the inverted compare line, however, then that cell deasserts its match line. If all of the match lines in the same word are asserted, indicating that the pattern exactly matches the sequence of bits in the data word, then the AND gate belonging to that word asserts the match word signal. An encoder or other circuit may be used to generate a code, based on which word match signals are asserted, that identifies the locations (or "addresses") of those words in the memory. Thus, any pattern in the memory array can be quickly located by driving the compare lines with the values in the pattern.

FIG. 2A illustrates an exemplary dual port CAM cell, including the storage logic and comparison logic. The storage logic comprises a pair of cross coupled inverters 200 and 204 and two pass transistors 208 and 212. The output terminal of inverter 200 represents the cell value D, and the output terminal of inverter 204 represents the inverse of the cell value, D'. The gates of the pass transistors 208 and 212 couple to the word line (WL), so that the pass transistors 208 and 212 become activated when the word line is asserted. The source and drain terminals of the Act pass transistor 208 couple the main bit line (BL) to the input terminal of inverter 204 and to the output terminal of inverter 200. Similarly, the source and drain terminals of the pass transistor 212 couple the inverted bit line (BL') to the input terminal of inverter 200 and to the output terminal of inverter 204. If the cell is activated by asserting the word line, then the pass transistors 208 and 212 turn on. If complementary data values are driven onto the bit lines from hi the external memory control circuitry (not shown), then the inverters 200 and 204 will store the bit line values, implementing a memory write operation. If the control circuitry drives the main bit line B with a 1 value, for example, and drives the inverted bit line BL' a 0 value, then inverter 200 will settle into a logic 1 state. If the main bit line B is driven with a 0 value, however, and the inverted bit line BL' is driven with a 1 value, then inverter 200 will settle into a logic 0 state. If the control circuitry does not drive the bit lines when the pass transistors 208 and 212 are activated, then inverter 200 drives the main bit line B with the cell data value D, and inverter 204 drives the inverted bit line BL' with the inverted cell value D', corresponding to a memory read operation.

The comparison logic comprises a match detect transistor 224 and a pair of pass transistors 216 and 220 which are coupled to the storage logic. Specifically, inverter 204 drives the gate terminal of pass transistor 216, and inverter 200 drives the gate terminal of pass transistor 220. The source and drain terminals of pass transistor 216 couple the main compare line CL to the gate of match transistor 224, and the source and drain terminals of transistor 220 couple the inverted compare line CL' to the gate of the match transistor 224. The source and drain terminals of the match transistor 224 couple circuit ground to the match line ML. If inverter 200 holds a logic 1 value, then the gate terminal of transistor 220 is activated, coupling the gate terminal of the match transistor 224 to the inverted compare line CL'. If inverter 204 lf holds a logic 1 value, however, then the gate terminal of transistor 216 is activated, coupling the gate terminal of the match transistor to the main compare line CL.

To compare a CAM cell to a particular bit value, the memory control circuitry charges the match line ML to a logic 1 value. Next, the control circuitry drives the bit value onto the compare line CL and the complement of the bit onto the inverted compare line CL'. If the cells holds a logic 1 value, represented by the state of inverter 200, then the logic 0 value of inverter 204 will cut off pass transistor 216, and pass transistor 220 will be turned on, coupling the gate terminal match transistor 224 to the inverted compare line CL'. If the value of the inverted compare line CL' is logic 0, then the match transistor 224 cuts off, maintaining the match line at its precharged value of logic 1. If the value of the inverted compare line CL' is logic 1, however, then the match transistor 224 turns on, coupling the match line to ground. The comparison logic functions similarly if the cell holds a logic 0 value on the output terminal of inverter 200. If the inverter 200 holds a logic 0, then inverter 204 turns on pass transistor 216, coupling the gate terminal of match transistor 224 to the main compare line CL, and pass transistor 220 turns off. If the main compare line CL is driven with a logic 1 value, then the match transistor 224 turns on, coupling the match line to ground. If the main compare line holds a logic 0, however, then the match transistor 224 turns off, and the match line maintains its precharged value of logic 1.

FIG. 2B illustrates an exemplary single port CAM cell. The architecture of the single port CAM resembles that of the dual port CAM, except that the main bit line and main compare line share the same signal trace, and the inverted bit line and inverted compare line share the same signal trace. Accordingly, a single port CAM cannot handle compare operations at the same time as read or write cycles, as can a dual port CAM.

Cell Faults

Manufacturing defects often cause the faults in the comparison logic. Cells faults can occur in either the storage logic or the comparison logic. Storage logic faults generally include unlinked faults, linked faults, neighborhood pattern sensitive faults, and complex coupling faults. Unlinked faults represent faults that occur in specific cells, without regard to the values of nearby cells. Types of unlinked faults include stuck-at faults, in which a cell holds a particular data value permanently; stuck-open faults, in which a cell is inaccessible; transition faults, in which a cell cannot make a transition between two values; data retention faults, in which a cell fails to retain the correct logic value after a period of time; and coupling faults, in which the value of one cells affects the value of another cell. Table I summarizes unlinked faults.

TABLE I

Unlinked Cell Faults

| Name | Description |
| --- | --- |
| Stuck-At Fault | Cell holds either a 0 or a 1 permanently. |
| Stuck-Open Fault | Cannot read from or write value to cell. |
| Transition Fault | Cell cannot transition from 1 to 0, or cell cannot transition from 0 to 1. |
| Data Retention Fault | Cell loses data after a period of time. |
| Coupling Fault | Cell value changes depending on the value of one or more other cell(s). |

Coupling faults include inversion faults, in which inverting the value of a first cell inverts the value of a second cell; idempotent faults, in which inverting the value of a first cell causes a particular value (either a 1 or a 0) to be stored in a second cell; bridging faults, in which two cells are shorted together; state faults, in which a first cell is forced to a certain value if and only if a second cell holds a particular value; and disturbance faults, in which a first cell changes value in response to a read or write operation in a second cell. Bridging faults can be one of two types: the AND-type or the OR-type. In an AND-type fault, a first cell is forced to 0 if and only if a 0 is stored in second cell. In an OR-type fault, a first cell is forced to 1 if and only if a 1 is stored in a second cell. Table II summarizes coupling faults.

TABLE II

Coupling Cell Faults

| Name | Description |
| --- | --- |
| Inversion Fault | Inverting the value of one cell causes an inversion in another cell. |
| Idempotent Fault | Inverting the value of one cell causes another cell to hold a specific value (either a 1 or a 0). |
| Bridging Fault | Storing a 0 in a cell causes another cell to hold a 0, but storing a 1 in the cell does not affect the other cell (AND-type). Storing a 1 in a cell causes another cell to hold a 1, but storing a 0 in the cell does not affect the other cell (OR-type). |
| State Fault | A first cell is forced to either a 1 or 0 if and only if a second cell holds a particular value. |
| Disturbance Fault | Reading or writing one cell inverts the value of another cell. |

Other cell faults include linked faults, neighborhood pattern sensitive faults, and complex coupling faults. Linked faults comprise multiple coupling faults which occur when three or more cells interact to form faults. A first cell, for example, may affect the value of a second cell, which affects the value of a third cell. In another linked fault scenario, the first and third cells both affect the value of the second cell. The other previously discussed cell faults, by contrast, each occur between a single pair of cells. Neighborhood pattern sensitive faults typically appear as stuck-at, transition, or two-cell coupling faults, but only occur when nearby cells are in a particular state. Complex coupling are weak coupling faults that tend to occur only when multiple ports access the memory simultaneously. Table III summarizes these other cell faults.

TABLE III

Other cell faults

| Name | Description |
| --- | --- |
| Linked Fault | Involves two or more basic cell faults. |
| Neighborhood Pattern Sensitive Faults | A stuck-at, transition, or coupling fault that occurs when a neighboring cell is in a particular state. |
| Complex Coupling Fault | Weak coupling fault that tends to occur only when multiple ports simultaneously access a memory cell. |

Addressing and Read/Write Faults

To access memory cells, an address value corresponding to the desired cells must be provided to the control circuitry of the memory device 150. In response, the control circuitry activates the desired cells by asserting the word lines that correspond to the received addresses. Addressing faults occur when no cell is accessed for a given address, multiple cells are accessed simultaneously for a single address, when a cell is not accessible, and when a cell is activated for multiple addresses. Read/write faults either prevent read and/or write operations or permanently set the memory device to read or write. Addressing faults typically stem from defects in the control circuitry, while read/write faults can be caused by defects in the control circuitry or in the individual cells.

Comparison Faults

A fault in the comparison logic either prevents the cell from identifying a match or causes the cell to assert the match line when no match exists. In some cases, the match line ML is stuck at logic high, so that a comparison operation always results in a bit match. Alternatively, the match line ML is stuck at logic low, so that a comparison operation always results in a bit mismatch. Other types of faults affect the match line ML, depending on the data value stored in the cell during the compare operation. Comparison faults typically appear as stuck-at faults on the compare lines, stuck-at faults on the match line, stuck-on faults at the match transistor 224, stuck-open faults at the match transistor 224, stuck-on faults at the compare pass transistors 216 and 220, or stuck-open faults at the compare pass transistors 216 and 220.

Stuck-at faults on the compare lines occur when the main compare line CL or the inverted compare line CL' holds a fixed value, either logic 1 or logic 0, which the memory control logic cannot change. As a result, the match line ML becomes stuck at a particular value, either 1 or 0, depending on the cell value. Referring to FIG. 2A, if the cell value is logic 1, then pass transistor 220 is activated. With pass transistor 220 activated, the match line ML is stuck at 1 if the inverted compare line CL' is stuck at 0, or the match line ML is stuck at 0 if the inverted compare line CL' is stuck at 1. Similarly, if the cell value is logic 0, then pass transistor 216 is activated. With pass transistor 216 activated, the match line ML is stuck at 0 1 if the main compare line CL is stuck at 0, or the match line ML is stuck at 0 if the main compare line CL is stuck at 1. Other types of stuck-at faults may occur on the match line 224 as well, such as when the source and drain terminals of the match transistor 224 become permanently shorted, coupling the match line ML to ground. Stuck-open faults on the match transistor 224 also occur when the source and drain terminals become permanently open, thus holding the match line ML at the precharged value of logic 1 value during every compare operation.

Stuck-on faults at pass transistor 216 occur when the source and drain terminals are shorted, permanently coupling the gate of transistor 224 to the main compare line CL. Similarly, stuck-on faults at pass transistor 220 occur when the source and drain terminals are shorted, permanently coupling the gate of transistor 224 to the inverted compare line CL'. Stuck-open faults at pass transistors 216 and 220 occur due to permanent open circuits between the source and drain terminals. Thus, a stuck-open fault at pass transistor 216 prevents coupling between the gate of match transistor 224 and the main compare line CL. Similarly, a stuck-open fault at pass transistor 220 will prevent coupling between the gate of match transistor 224 and the inverted compare line CL'. Stuck-on faults at pass transistor 216 and stuck-open faults at pass transistor 220 can only be detected when the cell stores a logic 1. On the other hand, stuck-open faults at pass transistor 216 and stuck-open faults at pass transistor 220 can only be detected when the cell stores a logic 0. Table IV summarizes the comparison faults.

TABLE IV

Comparison faults.

| Name | Description |
|---|---|
| Compare line stuck-at fault | The main compare line or inverted is fixed at a particular value. |
| Match line stuck-at fault | The match line is fixed at a particular value. |
| Pass transistor stuck-on fault | A pass transistor has a short circuit between source and drain, permanently coupling the compare line to the match transistor gate. |
| Pass transistor stuck-open fault | A pass transistor has an open circuit between source and drain, preventing coupling between the compare line and the match transistor gate. |

Faults Between the Storage and Comparison Logic

Other faults occur when word lines are shorted to match lines or when bit lines are shorted to compare lines (in a dual port memory). In a typical CAM, word lines and match lines typically run in parallel lines on a common layer of semiconductor. Similarly, bit lines usually are routed in parallel with compare lines, and both coexist on the same layer of semiconductor. Parallel traces in close proximity on the same semiconductor layer are more likely to affect each other, because the lines may become shorted or capacitively coupled. Capacitive coupling is an electromagnetic phenomenon that causes signal lines to react as if the lines were short circuited, even if the lines are not physically connected. If a word line is shorted to a match line, then the state of the word line affects the value of the match line (and vice versa), especially when a comparison operations occurs at the same time as a read/write operation. As a result, the match line may incorrectly identify a data match or may fail to properly identify a data match. In some cases, a short between the match line and word line may prevent activation of the word line. A short between a bit line and a compare line may cause the wrong value to be written to or read from the cell, if a compare operation occurs at the same time as a read or write operation.

Another type of storage/comparison fault occurs when the gate terminal of one of the pass transistors 216 and 220 becomes shorted to the drain terminal of the same transistor. A short between the gate and drain terminals causes the gate terminal to mirror any voltage value applied to the drain terminal (and vice versa). If the drain terminal is attached to the compare line, a gate-to-drain short during a comparison operation causes the transistor to transfer the compare value into the storage logic, potentially changing the stored value.

Testing CAM Faults

Memory faults of any kind are unacceptable, so memory devices are thoroughly tested during manufacturing and discarded if any faults are detected. A number of procedures exist for testing memory arrays. Memories typically are tested using a technique called the March C algorithm, for example, or a variant of March C such as the March C−, March C+, Smarch, or March LR algorithm.

The March C Algorithm includes six "passes," each of which addresses each memory cell individually. During Pass 1, March C writes a test pattern into the cells. The test pattern may be any desired sequence of bits, such as a "checkerboard" pattern, but often comprises all 0's. The 0 values can be written in any order, although the cells usually are addressed consecutively from address 0 to address N−1 or from address N−1 to address 0, where N represents the number of bits in the memory. Note that the memory also could be addressed one word at a time, in which case N would represent the number of memory words. Passes 2–5 also address each cell consecutively, executing two operations in sequence at each address. Passes 2 and 3 address the memory from address 0 to address N−1. During the first operation at each address in Pass 2, the test reads the current address to verify the value that was written during Pass 1. If the read operation does not return the value that was written during Pass 1, then a fault is detected. The fault may have occurred either during the write operation of Pass 1 or the read operation of Pass 2 (or both). Next, the test inverts (or "complements") the data value of the current address. Thus, if the current cell holds a 0 value, then the test writes a 1 value to the cell, and vice versa. Similarly, the first operation of Pass 3 performs a read operation to verify the value written in Pass 2, and the second operation writes the inverted value to the cell. If the read operation returns a value different that the one written in Pass 2, then a fault is detected.

Passes 4–5 address the memory from cell N−1 to cell 0. The first operation in Pass 4 reads the current cell to verify the value that was written during Pass 3, and the second operation inverts the value through a write operation. Similarly, each iteration of Pass 5 first reads the value of the current cell to verify the value that was written during Pass 4 and then writes a complemented value to the cell. If the wrong value is read during any iteration of Pass 4 or Pass 5, then a fault is detected. Such a fault may have occurred during the read operation itself or during the previous write operation (or both). During Pass 6, the test reads each cell to verify the value that was written during Pass 5. As in Pass 1, the cells may be addressed in any order but preferably are accessed from address 0 to address N−1 or from address N−1 to address 0. If the wrong value is detected in any cell during Pass 6, a fault is detected. Table V summarizes the operations of the March C Algorithm in which the initial test pattern is zero for each cell.

TABLE V

March C Algorithm.

| Pass | Start Address | End Address | Operation 1 | Operation 2 |
|---|---|---|---|---|
| 1 | 0 or N−1 | N−1 or 0 | Write 0 to Address | None |
| 2 | 0 | N−1 | Read 0 from Address | Write 1 to Address |
| 3 | 0 | N−1 | Read 1 from Address | Write 0 to Address |
| 4 | N−1 | 0 | Read 0 from Address | Write 1 to Address |
| 5 | N−1 | 0 | Read 1 from Address | Write 0 to Address |
| 6 | 0 or N−1 | N−1 or 0 | Read 0 from Address | None |

Unfortunately, the March C algorithm cannot detect faults which occur in the comparison logic of CAM arrays. In recent years, different techniques have been proposed for modeling and testing CAM arrays. Many of these more recent techniques, however, test only the comparison logic, neglecting the storage logic. Other recent techniques test both the comparison logic and the storage logic, but require a much lengthier and complicated test sequence than previous tests. At least one test, for example, requires as many as 24NL operations, where N represents the number of memory words and L represent the number of bits per word. The March C Algorithm, by comparison, requires only 10N operations.

For the foregoing reasons, an efficient and reliable technique for detecting faults in content addressable memory would greatly improve memory testing. Such a technique, if devised, should cover both storage logic faults and comparison logic faults, without requiring an excessive number of operations. Despite the apparent advantages that such a technique would provide, no device or method to date provides these features.

SUMMARY OF THE INVENTION

Accordingly, the present invention discloses a CAM testing procedure capable of detecting storage logic faults, comparison logic faults, and faults caused by interactions between the storage and comparison logic. In particular, tests are disclosed for both single port and dual port CAM's. To uncover faults in the storage logic, a series of read and write operations are performed on each memory word. The read and write operations may conform to a standard test sequence, such as the March C algorithm, or may comprise any other desired test sequence. The CAM test, however, intermixes comparison operations with the read and write operations to uncover faults in the comparison logic as well as in the storage logic.

For dual port memories, the test sequence comprises executing comparison operations in parallel with the read and/or write operations, thus revealing faults between the storage and comparison logic. A comparison operation preferably occurs concurrently with each read operation, except possibly during the final test pass, meaning that at least part of the compare operation overlaps with at least part of the read operation. During one pass, the comparison operation compares each memory word to the expected bit values in the word. If the word match line is deasserted, indicating a mismatch, then a fault is detected. During another pass, the comparison operation tests each word for the complement of the bit values in the word, in order to ensure that the memory is capable of detecting mismatches. If the cell comparison logic improperly asserts the match line, then a fault is detected. The concurrent operations thus detect faults between the storage and comparison logic by activating the storage and comparison logic at the same time. The concurrent operations also detect comparison faults, including stuck-at faults in the compare lines and match lines, as well as stuck-on and stuck-open faults in the comparison transistors.

For single port memories, the test sequence comprises performing a comparison operation following the read/write operations at each address, immediately verifying the comparison logic at each address. During certain test passes, comparison operation either evaluates the word for a match or for a mismatch. If the match line is asserted during a mismatch operation or deasserted during a match operation, then a fault is uncovered. Note that any single port test operation may be performed on a dual port memory. Following each read/write operation with a comparison operation uncovers comparison faults, including stuck-at faults in the compare lines and match lines, as well as stuck-on and stuck-open faults in the comparison transistors.

For both single port and dual port memory tests, the test introduces a set of "walking" passes which verify that individual cells can properly identify data mismatches. Each walking pass performs a set of comparison operations, preferably without concurrent read or write operations, each of which simultaneously compares all memory address simultaneously with a special compare word. During a first pass of the walking comparison, each memory cell contains a logic 1 value, and the compare word includes at least one logic 0 bit. In a preferred embodiment, the remaining bits in the compare word are logic 1 values. Accordingly, each cell which is compared with the logic 0 bit deasserts its match signal, causing the associated word match signal to deassert. If any word match signal becomes asserted, indicating that the word improperly matched its contents to the compare value, then a fault is detected. During each operation of the walking pass, the logic 0 value is located in a different bit of the compare word.

Similarly, a second pass of the walking comparison utilizes a test word consisting of a logic 1 value in one bit, with logic 0 values in the rest of the test word. Prior to the second walking pass, the test initializes each cell of the memory to logic 0, so that the logic 1 bit in the test word triggers a mismatch in every cell. Thus, if any cell indicates a match between the cell data and the test word, a fault is detected. The logic 1 bit is then "walked" to each bit location in the test word, executing a comparison operation for each bit position. The walking tests uncover comparison faults on a cell-by-cell basis and verify that the match lines in each cell are properly combined to produce the word match signal.

The dual port test, also known as the "concurrent detection test," comprises eight test passes. Passes 1, 2, 4, and 6–8 address each memory word separately. At each memory address, either a write operation, a read operation, or both a read operation and a write operation are performed. Pass 1 preferably performs only a write operation at each address, while Pass 8 performs only a read operation at each address. Passes 2, 4, 6, and 7 preferably perform a read operation, followed by a write operation, at each address. During passes 2, 4, 6, and 7, the test further executes comparison operations concurrently with the read operations. During passes 2 and 4, the comparison test words comprise the same values as the data stored in the memory cells. During passes 6 and 7, the comparison test words comprise the complements of the data values stored in the memory cells. Further, passes 2 and 4 preferably access the data words sequentially from the lowest address to the highest address, while passes 6 and 7 preferably access the words sequentially from the highest address to the lowest address. Passes 3 and 5 implement the walking comparison passes.

The single port test, also known as the nonconcurrent detection test, also comprises eight passes. Passes 1, 3, 5, and 8 of the nonconcurrent test comprise substantially the same operations as Passes 1, 3, 5, and 8 of the concurrent detection test. Passes 2, 4, 6, and 7 of the nonconcurrent test also comprise substantially the same operations as Passes 2, 4, 6, and 7 of the concurrent test, but without the concurrent comparison operations. Passes 2 and 4 preferably omit the comparison operations, while Passes 6 and 7 preferably implement the comparison operations following the read and write operations at each address.

Thus, the present invention comprises a combination of features and advantages that enable it to substantially advance the art by providing both single and dual port CAM testing procedures that cover not only storage faults, but also comparison faults and combination storage/comparison faults. These and various other characteristics and advantages of the present invention will be readily apparent to those skilled in the art upon reading the following detailed description of the preferred embodiments of the invention and by referring to the accompanying drawings.

BRIEF DESCRIPTION OF THE DRAWINGS

A better understanding of the present invention can be obtained when the following detailed description of preferred embodiments is considered in conjunction with the following drawings, in which:

FIGS. 4A–C illustrate the flowcharts of a preferred embodiment of a dual port memory test;

FIG. 6 shows the block diagram of a built in self test controller, constructed in accordance with a preferred embodiment.

DETAILED DESCRIPTION OF THE PREFERRED EMBODIMENTS

Figure 1:
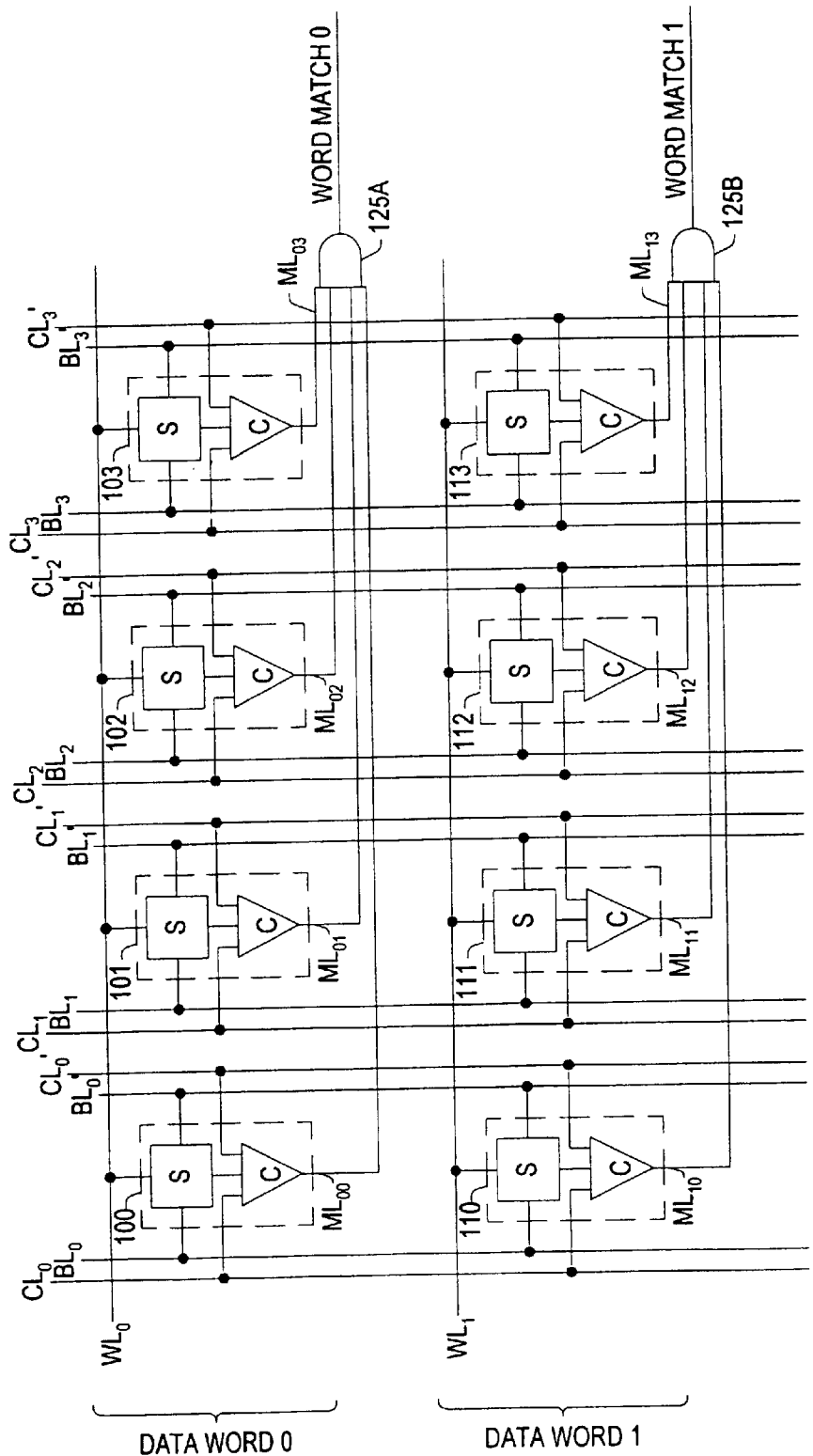
FIG. 1 represents a prior art content addressable memory array.
Figure 2A:
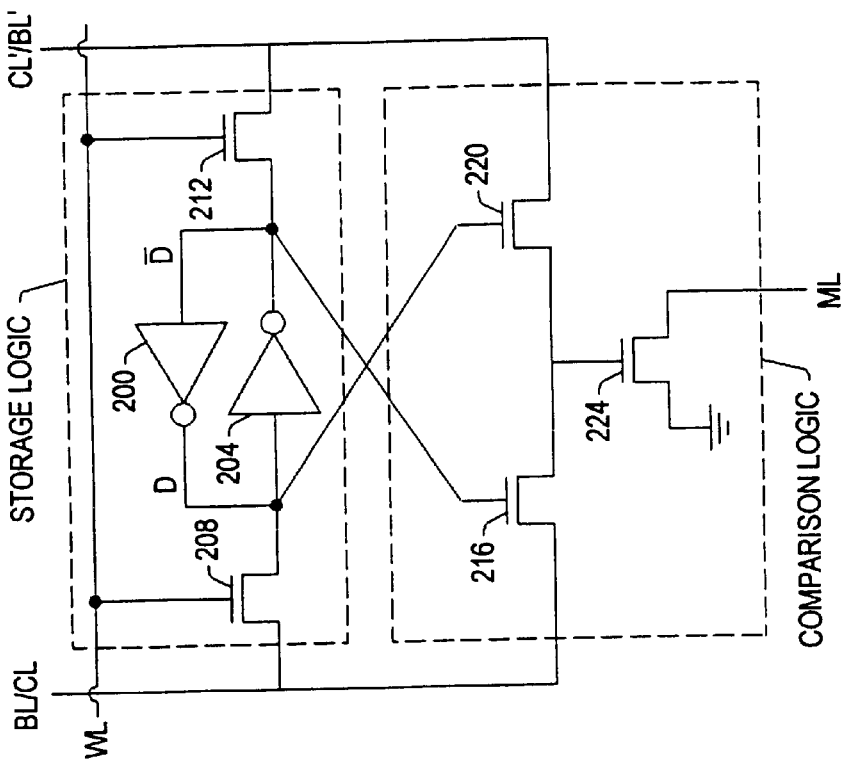
FIG. 2A shows a prior art dual port content addressable memory cell, including storage and comparison logic.
Figure 2B:
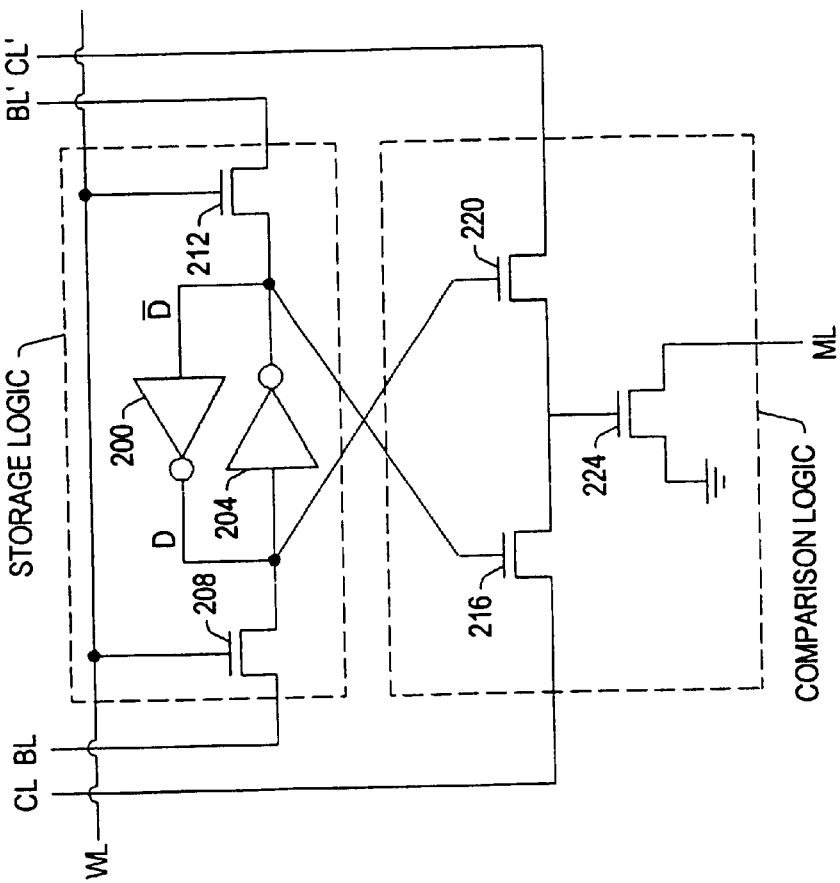
FIG. 2B shows a prior art single port content addressable memory cell, including storage and comparison logic.
Figure 3:
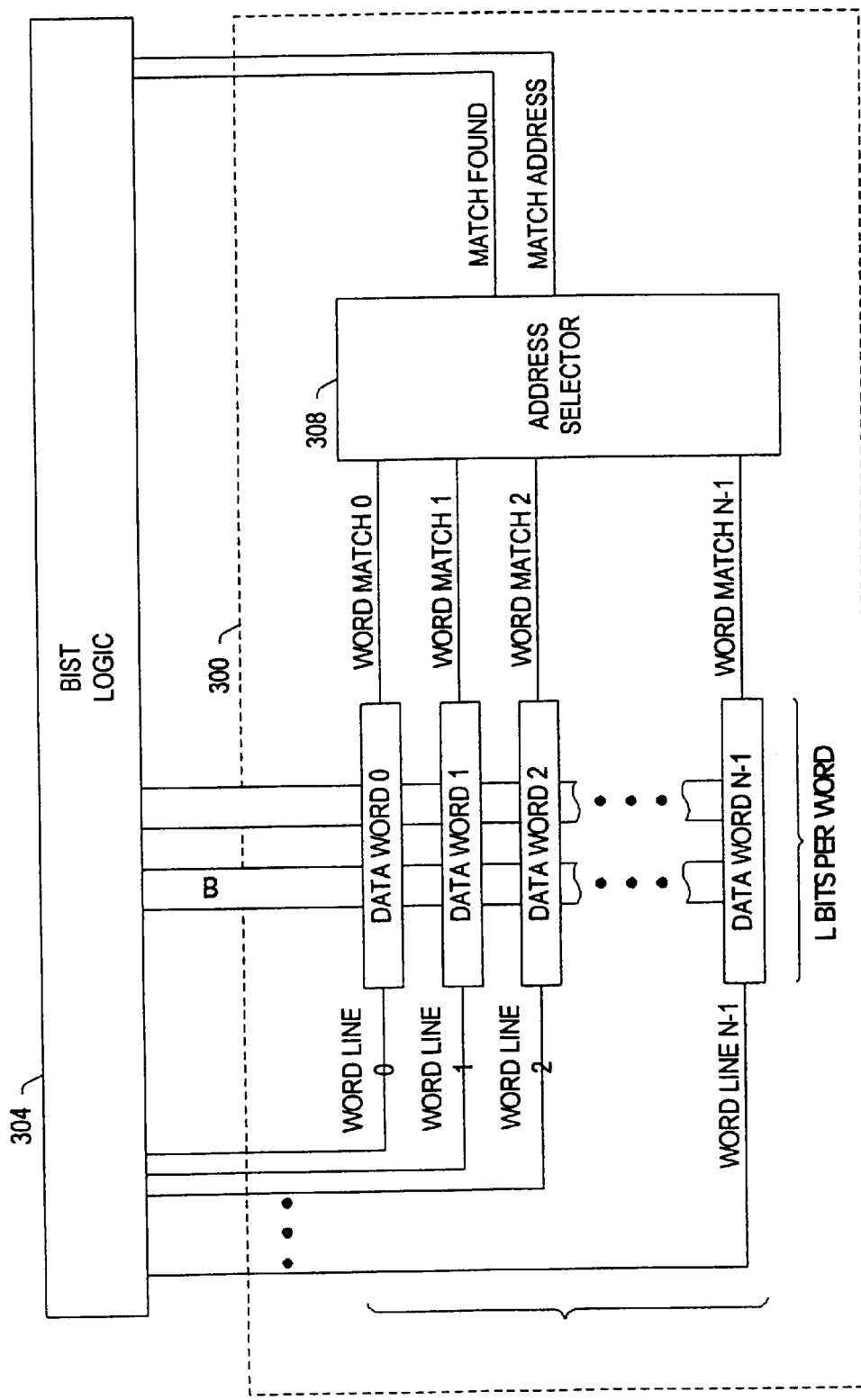
FIG. 3 shows a content addressable memory array coupled to a built in self test controller constructed according to a preferred embodiment.

FIG. 3 depicts an exemplary memory testing architecture, comprising a CAM array 300 coupled to a built in self test (BIST) logic device 304. The CAM array 300 comprises an array of N data words, each word including a plurality L of data cells. The first three data words, data word 0, data word 1, and data word 2 are shown explicitly, along with final data word N−1. For purposes of this disclosure, data word 0 represents the data cells at memory word address 0, data word 1 represents the group of data cells at memory word address 1, and data words 2 through N−1 represent the group of data cells at memory word addresses 2 through N−1, respectively. As depicted, the memory testing architecture comprises separate bit and compare lines and thus represents a dual port architecture. In an alternative embodiment, the bit lines and compare lines may be combined to implement a single port architecture.

Each data word couples to a common set of bit lines, which preferably include one main bit line and one inverted bit line for each cell, or a total of L main bit lines and L inverted bit lines for the entire array 300. Similarly, all of the data words couple to a common set of compare lines, including a main compare line for each of the L bits and an inverted compare line for each of the L bits. In addition, each data word includes a distinct word line, permitting individual addressing of the words. As shown in FIG. 3, word lines 0 and 1 activate data words 0 and 1, respectively, while data words 2 through N−1 are activated by word lines 2 through N−1, respectively.

The CAM array 300 further includes an address selector 308, coupled to each word via a word match line. As shown in FIG. 3, data word 0 couples to the address selector 308 via word match line 0, data word 1 couples to the address selector 308 via word match line 1, and data words 2 through N−1 couple to the address selector 308 via word match lines 2 through N−1, respectively. The address selector 308 further couples to the BIST logic 304 via a match found signal and a match address signal. The address selector 308 activates the match found signal if at least one of the word match signals is asserted, or deactivates the match found signal if none of the word match signals is asserted. If one or more word match signals are asserted, then the address selector 308 encodes the address of data word having the lowest address of all data words with asserted match signals. Note that the address selector 304 may instead encode the address of the highest cell having an asserted match line.

The BIST logic 304 may be embodied as a state machine, computer system, or other electronic circuit capable of executing memory read, write, and compare operations in the memory array 308. The BIST logic 304 thus is capable of asserting/deasserting the bit lines during write operations, sampling the bit line values during read operations, and driving the compare lines during comparison operations. In a preferred embodiment, the BIST logic 304 is manufactured integrally with the memory array 308, on a common substrate. Thus, the BIST logic 304 preferably includes data, address, and control input signals (not shown) that provide access to the memory array 308 by an external circuit. Table VI summarizes the dual port test sequence implemented by the BIST logic 304, as explained below.

TABLE VI

Dual port test sequence.

| Pass | Start Address | End Address | First Operation (Concurrent Operation) | Second Operation | Operations |
|------|---------------|-------------|----------------------------------------|------------------|------------|
| 1 | 0 | N−1 | Write all 0's (None) | None | N |
| 2 | 0 | N−1 | Read all 0's (Match Compare: all 0's) | Write all 1's | 2N |
| 3 | 0 | L−1 | Walking Compare: Single 0 | None | L |
| 4 | 0 | N−1 | Read all 1's (Match Compare: all 1's) | Write all 0's | 2N |
| 5 | 0 | L−1 | Walking Compare: Single 1 | None | L |
| 6 | N−1 | 0 | Read all 0's (Mismatch Compare: all 1's) | Write all 1's | 2N |
| 7 | N−1 | 0 | Read all 1's (Mismatch Compare: all 0's) | Write all 0's | 2N |
| 8 | 0 | N−1 | Read all 0's | None | N |

The dual port memory test comprises eight passes. Pass 1 initializes the memory cells to hold a predetermined data pattern. In a preferred embodiment, the data pattern represents all 0's, though the data pattern could represent any desired values, such as a conventional "column stripe" pattern of alternating 0's and 1's across each row. The operations of Pass 1 may address the memory words in any desired order. If a write failure occurs during Pass 1, the failed value will be detected during a read operation in Pass 2. Pass 1 thus identifies stuck-at-0 faults on the match line, stuck-on faults at the match transistor 224, stuck-open faults at comparison pass transistor 216, and stuck-on faults at comparison pass transistor 220.

Pass 2 of the dual port memory test preferably addresses the memory array sequentially from data word 0 to data word N−1, executing a read operation and a write operation at each address. Each read operation examines one data word to verify that the data was properly written during Pass 1. Because each cell preferably holds a logic 0 following Pass 1, any memory address at which the read operation returns a logic 1 is considered faulty. Following the read operation, the test performs a write operation to complement the data value of the current word. Because Pass 1 preferably writes logic 0 to each cell, the write operation of Pass 2 preferably writes a logic 1 value to each cell. After performing the read operation and write operation at a particular address, the dual port memory test advances to the next address to perform the next iteration.

Concurrently with the read operation at each address during Pass 2, the dual port memory test executes a compare operation via the compare lines. The comparison operation compares the contents of the memory array to a compare word that matches the data written to the current address during Pass 1. Accordingly, the comparison operation of Pass 2 drives all of the compare lines with logic 0 values, and any fault-free data word comprising all 0's asserts its word match line in response. Because Pass 2 complements each data word during the write operation, cells having addresses lower than the current test address hold logic 1 values. Thus, only the cell at the current test address and cells with higher addresses are expected to assert word match lines during the comparison operation of Pass 2.

Because the address selector 308 outputs the lowest matched address via the match address signal, the match address signal identifies the address of the word currently under test, if the comparison operation is successful. If the match address is higher or lower than the current test address, then a fault may exist in a previous cell or in the cell under test. A fault in a previous cell may have occurred, for example, if a previous write operation failed to properly set the value of a memory word. If the previous memory word matches the compare value of all 0's, then the address selector will output the address of the previous memory word, since the previous word has a lower address than the current word. A fault in a previous cell also may have occurred if the comparison logic in a previous cell improperly indicates a data match, even though the cell contents do not match the compare word. If a fault in a previous cell causes the match line of the faulty cell to become asserted during the current test iteration, then the match address signal will hold a lower address than the current test address.

A match address that is higher than the current address, however, means that the current cell data does not match the compare word, indicating that a fault may exist in the current test cell. Such a fault may occur, for example, if one or more of the word bits were improperly set during the write operation of Pass 1. The fault may also occur if the bits are properly set to all 0's but the comparison logic fails to detect a match by asserting the word match signal. Pass 2 detects stuck-at-1 faults on the main compare line, stuck-at-1 and stuck-at-0 faults on the match line, stuck-open faults at the match transistor 224, and other faults, including faults between the comparison logic and storage logic.

Pass 3 represents a walking comparison pass that verifies the capability of the memory to detect mismatches. At the beginning of Pass 3, all cells in the memory hold logic 1 values, as a result of the write operations of Pass 2. During Pass 3, the test places a series of compare words onto the compare lines. The compare words exactly match the data words, except that one bit of each compare word is complemented with respect to the corresponding bit of the data word. Accordingly, each corresponding data bit will fail to match the inverted compare bit, resulting in a mismatch at each data word. Thus, each data word should deassert its word match line, since one bit in each word deasserts its match line.

During each iteration of Pass 3, a different bit in the compare word is complemented, and the mismatch is tested in each bit of the data word. Pass 3 thus repeats once for each bit in the compare word. Because the data words during Pass 3 hold logic 1 values, the compare word consists of logic 1 values, except for a logic 0 value in one bit. Allowing the variable k to index the iterations from 0 to L−1, expression (1) gives the value of the compare word for each iteration:

$$\text{compare word} = 2^L - 2_k - 1 \tag{1}$$

Table VII illustrates an exemplary sequence of compare words for L=4 bits per word. Note that the bit index k may take on the values {0, L−1} in any desired order.

TABLE VII

| Compare words for Pass 3, L = 4. | |
| --- | --- |
| k | compare word |
| 0 | 1110 |
| 1 | 1101 |
| 2 | 1011 |
| 3 | 0111 |

If any word asserts the word match line during Pass 3, improperly indicating a match, then a fault is detected in that word. Such a fault may be due to a fault write operation in Pass 2, for example, during which a logic 0 value was written to the cell instead of a logic 1 value. Alternatively, the fault may represent a comparison fault that causes one of the data bits to assert the match signal, even if the compare line and bit line do not match; or the fault may represent a stuck-at-0 fault on the inverted compare line CL'. Pass 3 detects stuck-at-0 faults on the inverting compare line, stuck-at-1 faults on the match line, stuck-open faults at the match transistor 224, and other faults. Note that Pass 3 may occur after Pass 6 if desired, since the memory array is initialized with all 1's during Pass 6.

Pass 4 addresses each memory word sequentially, preferably from the lowest word address to the highest word address. At each address, Pass 4 executes a read operation, followed by a write operation. Concurrently with each read operation, Pass 4 performs a compare operation. The read operation verifies the data written during Pass 2. Thus, if a read operation returns a logic 0 value in any word, a fault is detected. The fault may have occurred, for example, during the write operation of Pass 2, which stored logic 1 values in each bit. Alternatively, the fault may be a result of a read failure in Pass 4. Because the compare operation occurs concurrently with the read operation, the fault also may have been triggered by the comparison operation. Pass 4 thus detects faults between the comparison and storage logic. Following the read/compare operation at each address, Pass 4 complements the bit values in the test word. Because the test words preferably consist of logic 1's prior to Pass 4, each write operation stores logic 0 values in each of the bits. Pass 4 detects stuck-at-0 faults on the match line, stuck-on faults at the match transistor 224, and other faults.

Pass 5 represents a second walking pass, comprising a series of comparison operations in which exactly one bit of each word comprises a logic 1 value, thus producing a mismatch in one bit of each data word. During each iteration of Pass 5, a different bit holds the logic 1 value, so that each bit position is tested. Allowing the variable k to index the iterations from 0 to L-1, expression (2) gives the value of the compare word for each iteration:

$$\text{compare word} = 2^k \tag{2}$$

Table VIII illustrates an exemplary sequence of compare words for L=4 bits per word. Note that the bit index k may take on the values {0, L−1} in any desired order.

TABLE VIII

Compare words for Pass 5, L = 4.

| k | compare word |
|---|---|
| 0 | 0001 |
| 1 | 0010 |
| 2 | 0100 |
| 3 | 1000 |

If any word asserts the word match line during Pass 5, improperly indicating a match, then a fault is detected in that word. Such a fault may be due to a fault write operation in Pass 4, for example, during which a logic 1 value was written to the cell instead of a logic 0 value. Alternatively, the fault may represent a comparison fault that causes one of the data bits to assert the match signal, even if the compare line and bit line do not match; or the fault may represent a stuck-at-0 fault on the main compare line CL. Note that Pass 5 may occur after Pass 1 and/or after Pass 7 if desired, since the memory array is initialized with all 1's during Passes 1 and 7.

Pass 6 addresses the memory words from address N−1 to address 0, in contrast with previous passes, which address the memory words from 0 to N−1. As in other passes, Pass 6 comprises a read operation executed concurrently with a compare operation. In contrast with previous passes, however, the compare word in Pass 6 represents the complement of the data word stored during the most recent write operation. Because the most recent operation (i.e., Pass 4) wrote logic 0 values to the cells, the compare word during Pass 6 consists of logic 1 values. The comparison operation of Pass 6 thus produces a mismatch result at each test address, if the test word is fault-free. Each read operation in Pass 6 verifies that each bit of the test word holds the logic 0 value that was written during Pass 4. If a read operation returns a logic 1 value in any of the bits, perhaps due to a write failure in Pass 4 or a read failure in Pass 6, then a fault is declared. Note that faults between the storage and comparison logic may be induced by the concurrent comparison operation during the read operation. Following each read/compare operation, Pass 6 executes a write operation that inverts the data bits in the test word. In accordance with a preferred embodiment, Pass 6 thus writes logic 1 values to each data word.

Because Pass 6 addresses the memory from the highest word address to the lowest word address, all words at addresses less than or equal to the test address contain logic 0 values, and all words at addresses greater than the test address contain logic 1 values prior to the write operation. Thus, during each comparison operation, the previous test address should represent the lowest-addressed cell which matches the compare word of all 1's. Further, no data word should contain all 1's during the first comparison operation (at address N−1). Accordingly, the address selector 308 should deassert the match found signal during the first compare operation if the memory is functioning properly. During subsequent iterations, the match found signal should be asserted, and the address selector 308 should encode the match address lines with address that is one word higher than the test address.

If a data word asserts its word match signal during the first compare operation, then a fault is detected. Similarly, a fault is detected if the test word or a word having an address lower than the test word asserts its word match signal during a subsequent iteration. Faults that occur during the compare operation of Pass 6 may be caused by a failure in the write operation of Pass 4, for instance, or by a storage/comparison logic fault that is induced by the concurrent read and compare operations in Pass 6. Pass 6 also detects interport faults between the main compare line CL and the main bit line BL, as well as interport faults between the inverted compare line CL' and the inverted bit line BL'.

Pass 7 addresses the data words from N−1 to 0, executing a concurrent read/compare operation in each word, followed by a word write operation. Each read operation verifies that the word contains the data value written during Pass 6, and the write operation stores the complement of the data word stored during Pass 6. Thus, in a preferred embodiment, each read operation verifies that the bit values comprise logic 1 values, and the write operation stores logic 0 values in each bit. If a read operation detects a logic 0 value in any bit, then a fault is declared. The fault may be caused by the read operation itself, if a read failure occurs, or may be the result of a faulty write operation during Pass 6. Pass 7 will detect faults between the storage and comparison logic, since the concurrent compare operation will illuminate faults in the storage logic.

The compare operation of Pass 7 preferably utilizes a compare word that represents the complement of the data word written during Pass 6, in order to ensure that each word can properly detect and indicate a compare mismatch. Because the data words written in Pass 6 preferably comprise all 1's, the compare word in Pass 7 consists of all 0's. Because Pass 7 accesses the words from the highest address to the lowest address, the address selector 308 should indicate "no match" by deasserting the match found signal during the first comparison operation (at address N−1). During subsequent compare operations, the word at one address higher than the current test address should match the test word, since Pass 7 wrote logic 0 values to the word at one address higher than the current test address during the previous iteration.

Accordingly, the address selector 308 should assert the match found signal during subsequent iterations, and the match address signal should indicate the address one address higher than the test address. If the test word or a word at a lower address indicates word match, or if the previous (i.e., higher) cell fails to indicate word match, then a fault is detected. Such a fault can indicate a short or other problem in the comparison logic, and the fault may have been induced by the concurrent read operation if the fault represents a storage/comparison logic fault.

Pass 8 verifies that each memory word consists of the logic 0 values which were written during Pass 7. Pass 8 can access the memory words in any desired order, although a preferred embodiment contemplates addressing the memory from 0 to N−1. If any read operation detects a logic 1 value in one or more bits, then a fault is declared. The fault may be a result of a write failure during Pass 7, for example, or a read failure in Pass 8.

Note that the dual port memory test comprises a total of 10N+2L operations. Pass 1 includes one read operation at each of N addresses, for a total of N operations. Passes 2, 4, 6, and 7 include one read/compare operation and one write operation, or two operations, at each of N addresses, a total of 8N operations for the 4 passes. In addition, Passes 3 and 5 each include L compare operations, and Pass 8 includes a write operation at each of the N addresses.

Figure 4A:
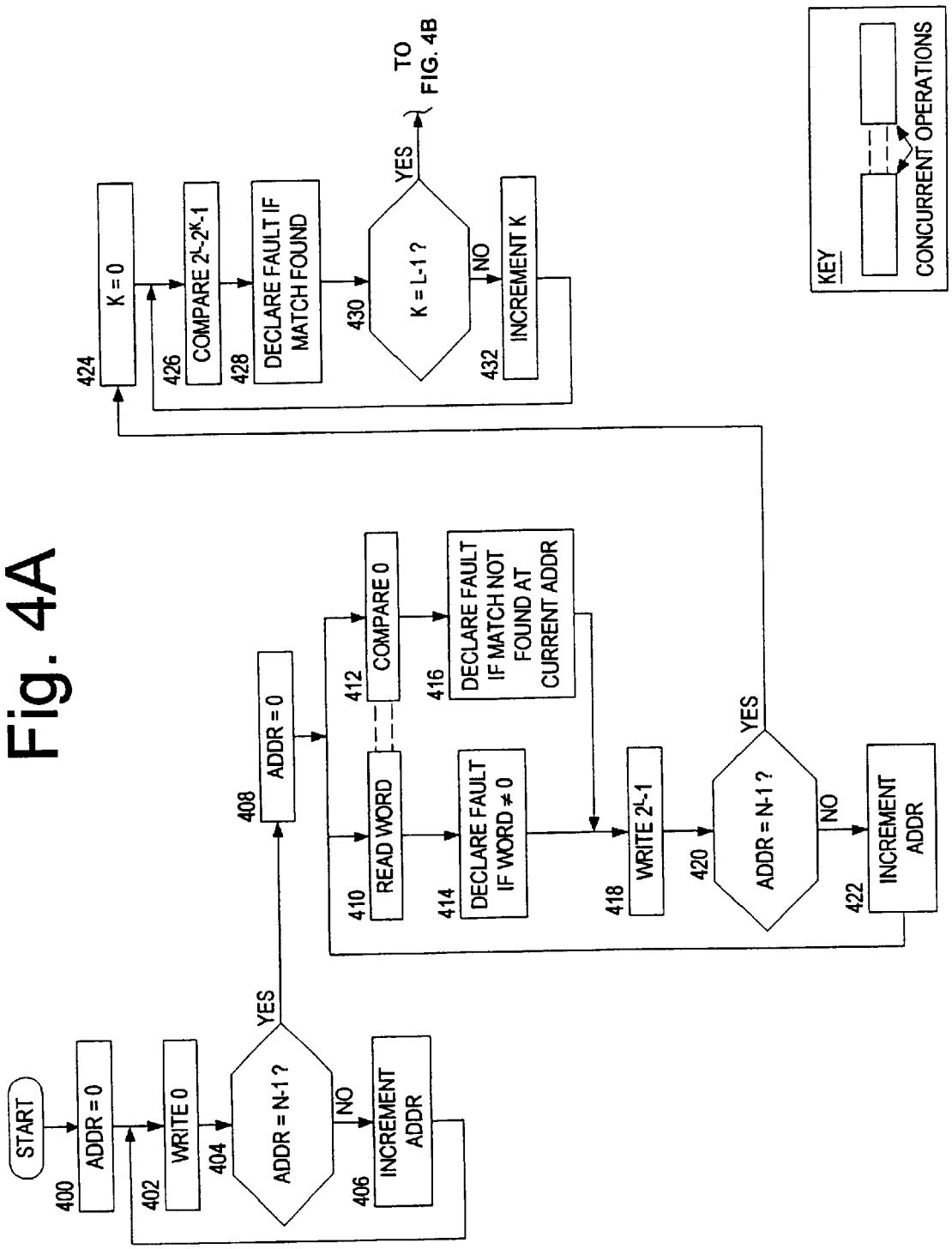
Figure 4B:
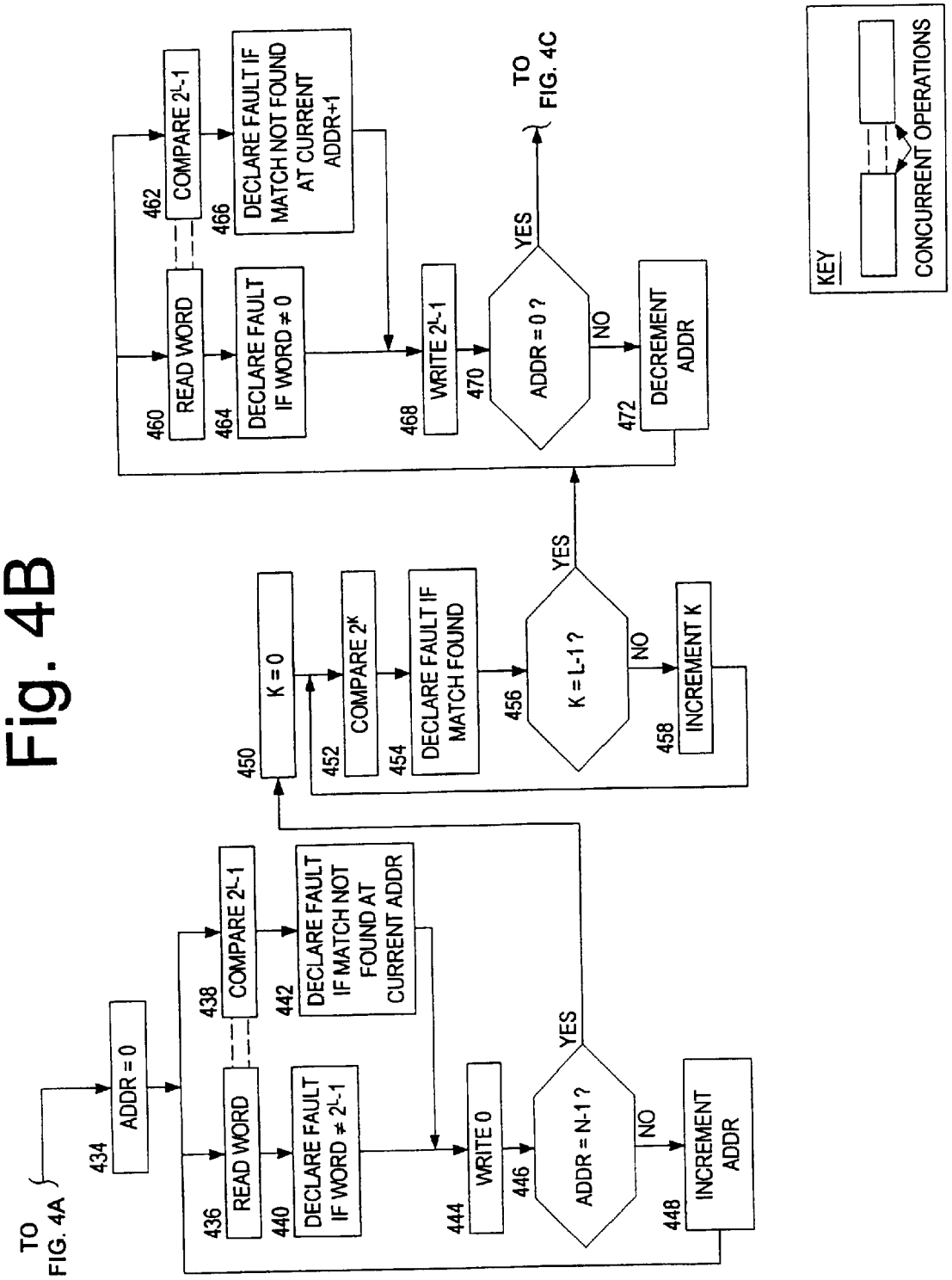

FIGS. 4A–C illustrate a flowchart of the concurrent test summarized in Table VI. The test begins at block 400 in FIG. 4A, in which the test address (ADDR) is initialized to 0. Next, in block 402, the test writes the test data pattern to the memory word at the current address. The data pattern preferably consists of logic 0 values in each bit, although any combination of 1's and 0's is acceptable. As shown in blocks 404 and 406, the test address is incremented until the test address reaches N−1, where N represents the number of words in the memory. If the test address reaches N−1 in block 404, then the test proceeds to Pass 2, which begins in block 408. Note that Pass 1 may address the memory words in any desired order, such as from N−1 to 0, randomly, or in any other sequence.

To begin Pass 2, the test address is initialized to 0 in block 408. Next, the test performs a read operation at the current address (block 410) along with a concurrent compare operation (412). The compare operation drives the compare lines of the memory with the data pattern that was written during block 2 of Pass 1 (i.e., all 0's), so all properly functioning words with addresses greater than or equal to the current test address assert their word match lines. A fault is declared either if the data returned from the read operation are not all 0's (block 414) or if the compare operation does not return the current address as a match (block 416). Next, in block 418, the test writes the value $2^L-1$ (i.e., all 1's) to the current memory word. The test address is then incremented in block 422, if the address is less than N−1 (block 420). If the test address is equal to N−1, however, then Pass 2 ends, and Pass 3 begins in block 424.

Pass 3, which represents the first walking comparison pass, starts by initializing the index variable k. The variable k preferably is initialized to 0, although any initial value from 0 to L−1 is acceptable. In block 426, the test drives the compare lines with the compare word for the $k^{th}$ iteration. As shown above in expression (1), the compare word is given by $2^L-2^k-1$. Thus, the $k^{th}$ bit of the compare word is logic 0, and the remaining bits hold logic 1 values. Because the memory words were written with solid 1's during the previous iteration, the 0 bit in the compare word should mismatch with one bit in each word, and the compare operation should result in no word matches. Thus, if a match is detected (block 428), then a fault is declared. If the index variable k is less than L−1, then k is incremented in block 432, and operation resumes at block 426. Otherwise, Pass 3 completes, and Pass 4 begins at block 434 of FIG. 4B.

Now referring to FIG. 4B, block 434 starts Pass 4 by initializing the test address to 0. Next, the test reads the memory word at the current address (block 436) and executes a concurrent compare operation (block 438). Each memory word should contain $2^L 31 1$ (i.e., all 1's), as written during block 418 of Pass 2, assuming no fault has occurred. Accordingly, the compare word, which is driven on the compare line, is also represented by $2^L-1$. A fault is declared if the read operation does not return the value $2^L-1$ (block 440) or if the compare operation does not return a match at the current address (block 442). The test then complements the bit values in the current word by writing all 0's to the current test address. Next, if the test address is less than N−1 (block 446), the test increments the address (block 448) and returns to concurrent blocks 436 and 438. If the test address equals N−1 in block 446, however, then Pass 4 ends, and control advances to block 450.

Blocks 450 through 458 represent Pass 5 of the dual port test, which comprises the second "walking" pass. Beginning with block 450, the index variable k is initialized to 0. Next, in block 452, the test drives the compare lines with the value $2^k$, which comprises a compare word consisting of logic 0's, except for a logic 1 in one bit. Because the memory words were written with logic 0's during the previous pass, no word match signal should be asserted. Therefore, if a match is found, a fault condition is declared (block 454). Pass 5 repeats the compare operations of block 452 and 454, incrementing k each iteration (block 458), until k equals L−1. When k equals L−1 (block 456), Pass 5 terminates.

Pass 6 begins at blocks 460 and 462, which are executed concurrently. Note that the test address was last set during Pass 4 and currently equals N−1, or the highest word in the memory. During block 460, the test reads the memory word at the current test address, concurrently performing a compare operation in block 462 by driving the compare lines with the value $2^L-1$ (i.e., all 1's). Note that the compare value represents the complement of the value that was previously stored in the memory words in block 444 of Pass 4. Accordingly, memory words at addresses less than or equal to the current test word should not assert their word match signals in response to the compare operation of block 462. Similarly, no match word signal should be asserted during the first test iteration of Pass 6. As shown in block 466, if a word match is detected during the first operation, or if a word match is detected during subsequent iterations at an address that is less than or equal to the current test address, then a fault is declared. Similarly, a fault is declared if the data read does not return all 0's (block 464), as written in Pass 4. To complete the iteration, the test complements the current word value by writing all 1's to the current address (block 468). Next, if the test address is greater than 0 (block 470), then the test address is decremented in block 472, and Pass 6 resumes at concurrent blocks 460 and 462. If the test address equals 0 in block 470, however, then the test proceeds to Pass 7, as shown in FIG. 4C.

Referring now to FIG. 4C, Pass 7 begins by initializing the current address, in block 474, to N−1. Next, read block 476 and compare block 478 are executed concurrently. Read block 476 comprises a read operation to verify the memory contents of the current address, and the compare block 478 drives the compare lines with all 0's. Because the Pass 6 write operation (i.e., block 468) stored all 1's in the memory words, the memory read operation should return all 1's if no fault is present. Thus, if the read operation returns a value other than $2^L-1$, then a fault is declared in block 480. Because the compare word consists of all 0's, however, the word at the test address and at lower addresses should produce a mismatch in the comparison operation. Accordingly, if a word match is detected during the first iteration, or if a word match is detected during subsequent iterations at an address that is less than or equal to the current test address, then a fault is declared (block 482). Similarly, a fault is declared if the data read does not return all 1's (block 480), as written in Pass 6. Next, if the test address equals 0, the test progresses to Pass 8, beginning with block 490. Otherwise, the test address is decremented in block 488, and test repeats from concurrent blocks 476 and 478.

Pass 8 generally comprises reading the memory words to verify that the contents match the data written during Pass 7. Accordingly, the read operations may be implemented in any desired order. In a preferred embodiment, however, the read operations begin at test address 0, which represents the final address of Pass 7 (i.e., block 486). Thus, beginning with block 490, Pass 8 performs a read operation at the current address. If the read operation does not return 0, as written during Pass 7, then a fault is declared. Next, the test increments the current address in block 496 and repeats Pass 8 from block 490, until the address reaches N−1 (block 494). When address reaches N−1 in block 494, Pass 8, and thus the dual port test, ends.

To permit testing of single port CAM's, a single port test in accordance with a preferred embodiment includes eight passes that do not require concurrent operations. Table IX summarizes the operations of the single port CAM test.

TABLE IX

Single port test sequence.

| Pass | Start Address | End Address | First Operation | Second Operation | Third Operation | Operations |
|---|---|---|---|---|---|---|
| 1 | 0 | N-1 | Write all 0's | None | None | N |
| 2 | 0 | N-1 | Read all 0's | Write all 1's | None | 2N |
| 3 | 0 | L-1 | Walking Compare: Single 0 | None | None | L |
| 4 | 0 | N-1 | Read all 1's | Write all 0's | None | 2N |
| 5 | 0 | L-1 | Walking Compare: Single 1 | None | None | L |
| 6 | N-1 | 0 | Read all 0's | Write all 1's | Compare all 1's | 3N |
| 7 | N-1 | 0 | Read all 1's | Write all 0's | Compare all 0's | 3N |
| 8 | 0 | N-1 | Read all 0's | None | None | N |

Except for the comparison operations, the single port memory test comprises similar operations to the dual port test. Pass 1 initializes the memory cells to hold a predetermined data pattern, which preferably comprise all 0's. The operations of Pass 1 may address the memory words in any desired order. If a write failure occurs during Pass 1, the failed value will be detected during a read operation in Pass 2.

Pass 2 of the single port memory test preferably addresses the memory array sequentially from data word 0 to data word N-1, executing a read operation and a write operation at each address. Each read operation examines one data word to verify that the data was properly written during Pass 1. Accordingly, the read operations of Pass 2 check to ensure that each cell holds the value that was written during Pass 1. Because each cell preferably holds a logic 0 following Pass 1, any memory address at which the read operation returns a logic 1 is considered faulty. Following the read operation, the test performs a write operation to complement the data value of the current word. Because Pass 1 preferably writes logic 0 to each cell, the write operation of Pass 2 preferably writes a logic 1 value to each cell. After performing the read operation and write operation at a particular address, the single port memory test advances to the next address to perform the next iteration. Pass 2 of the single port test does not require compare operations.

Pass 3 represents a walking comparison pass, in which the compare word matches the data written during Pass 2, except in one bit. During each iteration of Pass 3, the complemented bit "walks" to a different bit position, causing a mismatch in one bit of each word. Accordingly, the one mismatched bit in each data word will deassert the word match line. In a preferred embodiment, the walking compare value is represented by $2^L-2^k-1$, where the variable k represents the iteration. The variable k preferably ranges from 0 to L-1, where k=0 represents the first iteration, and L is the number of bits per word. If any word asserts the word match line during Pass 3, improperly indicating a match, then a fault is detected in that word.

Pass 4 addresses each memory word sequentially, preferably from the lowest word address to the highest word address. Pass 4 executes a read operation, followed by a write operation, at each address. The read operation of Pass 4 verifies that each word contains the value written during Pass 2, which is $2^L-1$ in a preferred embodiment (i.e., all 1's). The write operation complements the bit values in the test word. Because the test words preferably consist of logic 1's prior to Pass 4, each write operation stores a logic 0 value in each of the bits. Pass 4 does not require compare operations.

Pass 5 represents a second walking pass, in which the compare word represents the data word written during Pass 4, except with one inverted bit. Because Pass 4 writes all 0's to the memory words, the walking compare word of Pass 5 comprises one walking "1" bit, with the remaining bits set to logic 0. Thus, the walking compare value is represented by $2^k$, where the variable k represents the position of the walking bit. The variable k preferably ranges from 0 to L-1, where k=0 represents the first iteration, and L is the number of bits per word. If any word asserts the word match line during Pass 5, improperly indicating a match, then a fault is detected in that word. If any word asserts the word match line during Pass 5, improperly indicating a match, then a fault is detected in that word.

Pass 6 preferably addresses the memory words in reverse order, ranging from address N-1 to address 0. Pass 6 executes three operations in sequence, including a read operation, a write operation, and a compare. The read operation verifies the data that was written during Pass 4, which comprises all 0's in a preferred embodiment. Thus, if a logic 1 value is returned by a read operation in any bit of the word, a fault is declared. The write operation then inverts the bits in the word, changing all of the logic 0's to logic 1 values. Next, the compare operation drives a compare word onto the compare lines that matches the data stored in the word during the write operation. Accordingly, the compare lines are driven with all 1's in a preferred embodiment. Because Pass 6 addresses the memory from the highest word address to the lowest word address, the lowest address matching the compare lines should be the current address, if all cells are functioning properly. Thus, a fault is declared if the address selector 308 indicates that a lower address, a higher address, or no address matches the compare word.

Pass 7 also addresses the memory from address N-1 to address 0, executing a read operation, a write operation, and a compare operation at each address. Each read operation verifies that the word contains the data value written during Pass 6, and the write operation stores the complement of the data word stored during Pass 6. Thus, in a preferred embodiment, each read operation verifies that the bit values comprise logic 1 values, and the write operation stores logic 0 values in each bit. If a read operation detects a logic 0 value in any bit, then a fault is declared. The fault may be caused by the read operation itself, if a read failure occurs, or may be the result of a faulty write operation during Pass 6. The compare word preferably matches the write word of Pass 7, or all 0's in a preferred embodiment. Because the memory is addressed from N-1 to 0 in Pass 7, the lowest matching address should be the current test address. Thus, if the address selector 308 indicates that a lower address, a higher address, or no address matches the compare word, then a fault is declared.

Pass 8 verifies that each memory word consists of the logic 0 values which were written during Pass 7. Pass 8 can access the memory words in any desired order, although a preferred embodiment contemplates addressing the memory from 0 to N-1. If any read operation detects a logic 1 value in one or more bits, then a fault is declared. The fault may be a result of a write failure during Pass 7, for example, or a read failure in Pass 8. Thus, the single port test identifies faults in a single port memory, without requiring the concurrent accesses of the dual port test. Note, however, that the single port test may be executed on a dual port memory.

Note that the single port memory test comprises a total of 12N+2L operations. Pass 1 includes one read operation at each of N addresses, for a total of N operations. Passes 2 and 4 include one read operation and one write operation, or two operations, at each of N addresses, a total of 4N operations for the 2 passes. In addition, Passes 3 and 5 each include L compare operations, a total of 2L operations for Passes 3 and 5. Passes 6 and 7 each include 3N operations, including a read operation, a write operation, and a compare operation, or a total of 6N operations for the two passes. Finally, Pass 8 implements a write operation at each of the N addresses.

Figure 5A:
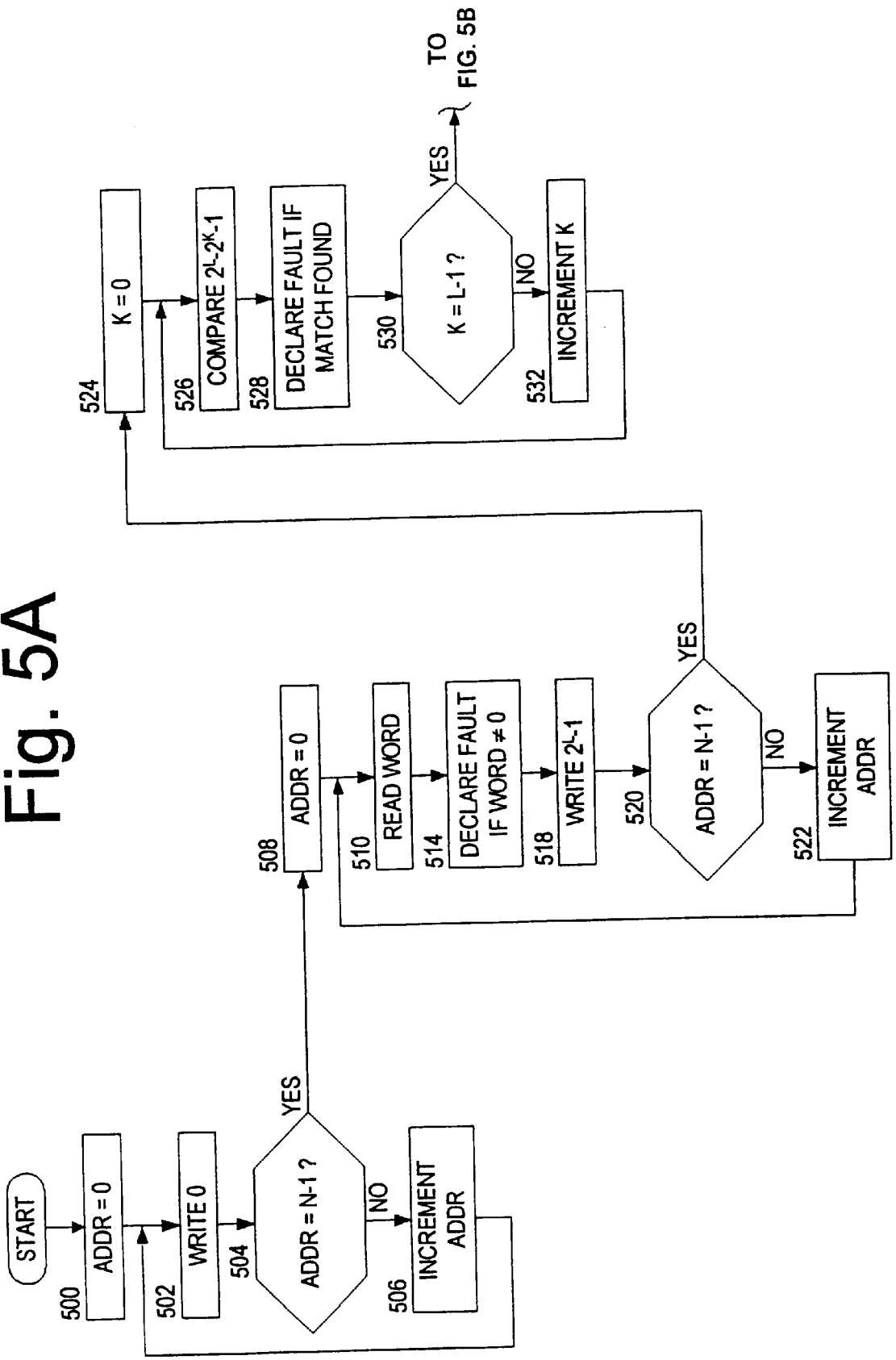
FIGS. 5A–C illustrate the flowcharts of a preferred embodiment of a single port memory test.
Figure 5B:
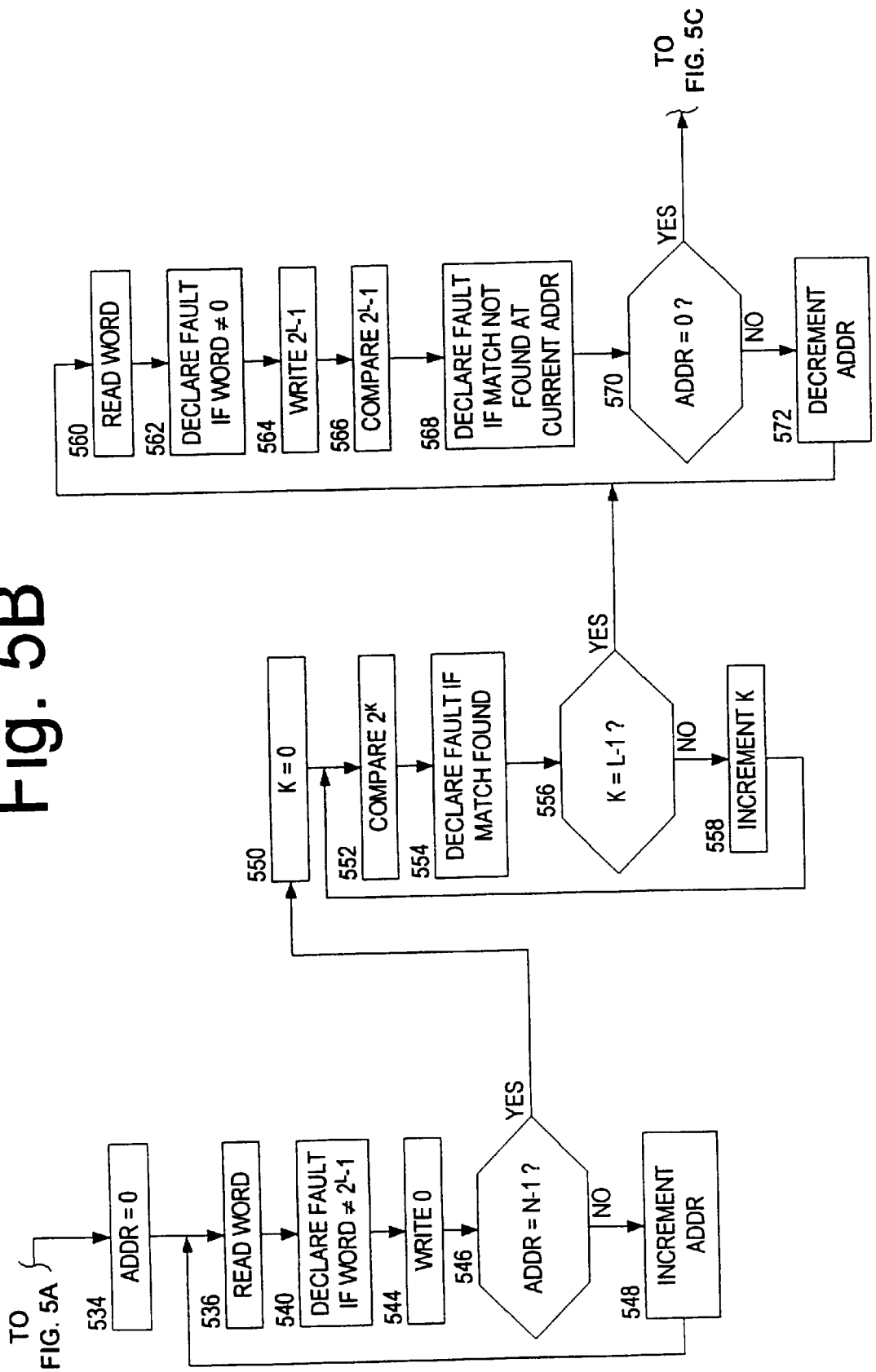
Figure 5C:
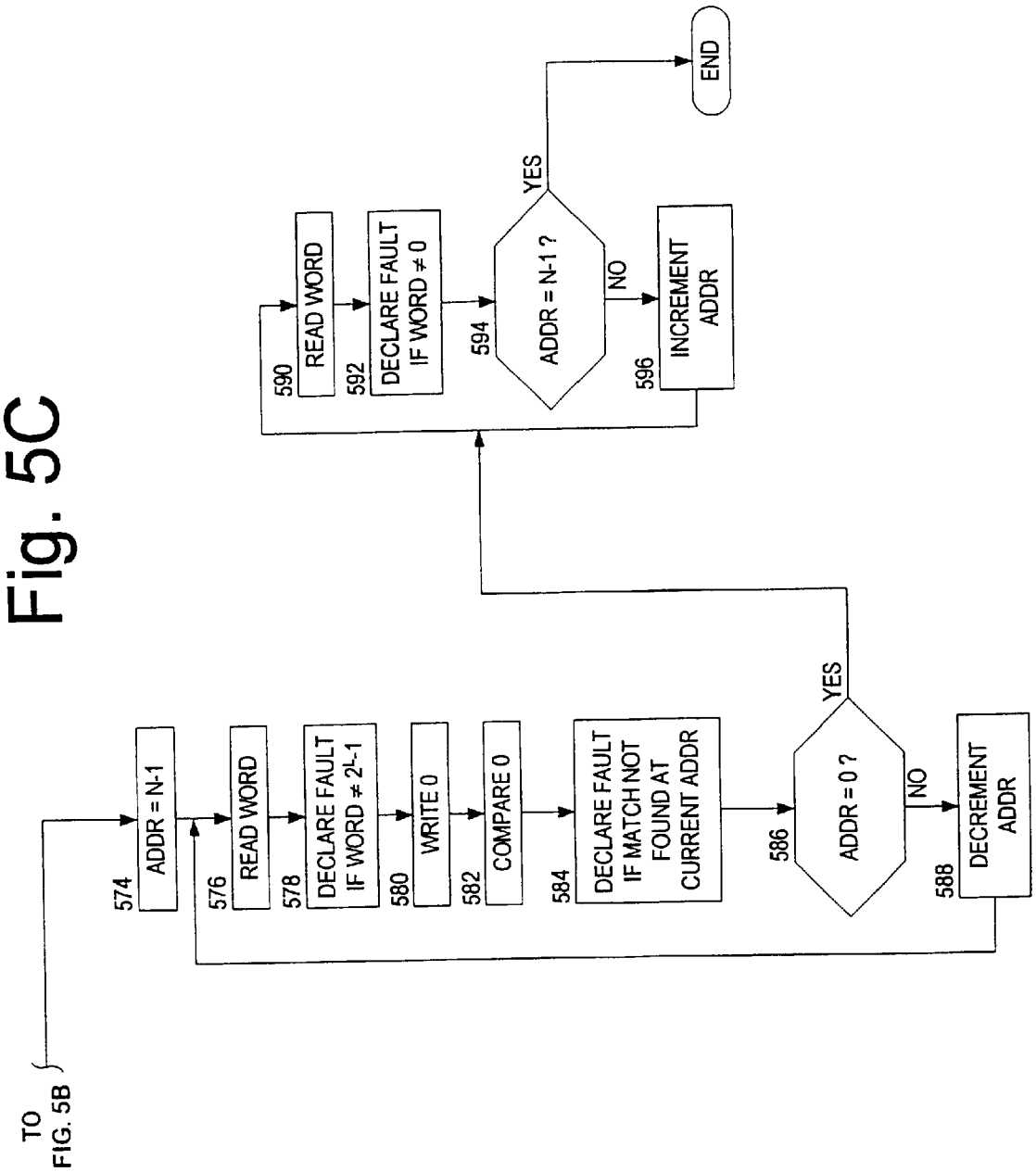

FIGS. 5A–C illustrate a flowchart of the single port test summarized in Table IX. The test begins at block 500 in FIG. 5A, in which the test address (ADDR) is initialized to 0. Next, in block 502, the test writes the test data pattern to the memory word at the current address. The data pattern preferably consists of logic 0 values in each bit, although any combination of 1's and 0's is acceptable. As shown in blocks 504 and 506, the test address is incremented until the test address reaches N−1, where N represents the number of words in the memory. If the test address reaches N−1 in block 504, then the test proceeds to Pass 2, which begins in block 508. Note that Pass 1 may address the memory words in any desired order, such as from N−1 to 0, randomly, or in any other sequence.

Beginning with block 508, Pass 2 initializes the test address to 0. Next, in block 510, the test reads the data word at the current test address. A fault is declared in block 514 if the data word does not match the data that was written in Pass 1, which is a word containing all 0's. Next, block 518 performs a write operation to invert the memory word. Because the memory was written with all 0's in Pass 1, the write operation of block 518 stores a memory word of all 1's (i.e., the value given by $2^L-1$, where L represents the number of bits per word). The single port test then increments the test address in block 522 and repeats blocks 510–518, until the test address reaches N−1 (block 520). When the test address reaches N−1, Pass 3 begins, as shown in blocks 524–532.

Pass 3 represents the first walking comparison pass, in which a single 0 bit walks across a compare background of all 1's. First, in block 524, the bit index k is initialized to 0. Next, in block 526, the test drives the compare lines with the value $2^L-2^k-1$. Note that the value of the bit index k determines the location of the single 0 bit within the compare word. Because the write operation of Pass 2 loaded the memory cells with all 1's, each compare operation in Pass 3 should result in a mismatch, if the cells are fault-free. Thus, in block 528, the test declares a fault if the comparison operation of block 526 results in a match in any memory word. Following blocks 526–528, the test increments the bit index k in block 532, unless k equals L−1 (block 530). If k equals L−1 in block 530, then Pass 3 ends, and Pass 4 begins at block 534 of FIG. 5B. Note that the value of k does not have to be incremented sequentially from 0 to L−1, but may be chosen from the range {0, L−1} in any order.

Now referring to FIG. 5B, Pass 4 begins in block 534 by initializing the test address to 0. Next, in block 536, the test performs a read operation to verify the value written during Pass 2. The value written during Pass 2 is $2^L-1$ (i.e., all 1's). Accordingly, a fault is declared in block 540 if the read operation returns a logic 0 value in any bit. Block 544 inverts the bit values of the test word by writing all 0's to the memory word. Next, if the test address is less than N−1 (block 546), the block 548 increments the address, and the test repeats block 536–544. When the test address reaches N−1, Pass 4 ends.

Pass 5 represents the second walking comparison pass, in which a single 1 bit walks across a compare background of all 0's. Beginning with block 550, the bit index k is initialized to 0. Next, the compare lines are driven with the compare word $2^k$. Note that the value of k in the compare word determines the bit location of the 1 value. Because the write operation of Pass 4 stored all 0's in each memory word, the compare word $2^k$ should not match any word in memory. Accordingly, if a match is detected in block 554, resulting from the compare operation of block 552, then a fault is declared. The bit index k is then incremented in block 558, if k does not equal L−1 (block 556). When k reaches L−1, Pass 5 ends. Note that the value of k does not have to be incremented sequentially from 0 to L−1, but may be chosen from the range {0, L−1} in any order.

Pass 6 begins with block 560, which performs a read operation at the current test address. Note that the test address, as set during the final iteration of Pass 4, equals N−1 at the beginning of Pass 6. If the read operation fails to return the value that was written during Pass 4, or all 0's, then a fault is declared in block 562. Next, block 564 inverts the bit values of the current address to $2^L-1$ (i.e., all 1's). Following the write operation of block 564, the compare lines are driven with the value of the write operation of block 564. Because Pass 6 addresses the memory words from the highest address (N−1) to the lowest address (0), the address selector 308 should indicate the current address as the lowest match address, if all cells are functioning properly. Thus, a fault is declared in block 568 if no match is found, or if the lowest match address is not the current test address. When the test address reaches 0 (block 570), the test proceeds to Pass 7, as shown in block 574 of FIG. 5C. Otherwise, the test address decrements (block 572), and blocks 560–570 repeat.

Now referring to FIG. 5C, Pass 7 begins in block 574 by initializing the test address to N−1. Next, in block 576, a read operation is performed to verify the data written during Pass 6 (i.e., block 564). The write operation of Pass 6 stored $2^L-1$ (i.e., all 1's) into the memory, so a fault is declared in block 578 if the read operation does not return $2^L-1$. Next, in block 580, the test inverts the word at the current address by writing all 0's to the memory cells. The test then performs a compare operation by driving the compare lines with the data value written to the current cell (i.e., all 0's). Because Pass 7 accesses the cells from address N−1 down to address 0, the current memory word should be the lowest-addressed word that contains all 0's. Accordingly, if the compare operation of block 582 fails to return a match or returns a match address not equal to the current test address, then a fault is declared in block 584. Next, the test address is decremented in block 588, and blocks 576–584 repeat, until the address reaches 0. When the address reaches 0, Pass 7 ends and Pass 8 begins.

Block 590 represents the first operation of Pass 8, in which a read operation is performed at the current address to verify the data written during Pass 7. Note that the current test address at the beginning of Pass 8 is address 0, as set during Pass 7. If the read operation returns a value other than 0, which is the value written during Pass 7, then a fault is declared in block 592. The address then increments in block 596, and blocks 590–592 repeat until the address reaches N−1 (block 594). The single port test completes following block 592, when the test address reaches N−1.

FIG. 6 illustrates a preferred embodiment of the built in self test (BIST) logic 304 of FIG. 3, comprising a BIST controller 600 coupled to a memory control logic unit 616 via a plurality of registers 604, 608, and 612. The BIST logic 304 utilizes register 604 for read operations, register 608 for write operations, and register 612 for compare operations. The BIST controller 600 transmits an expected read data signal to the read register 604, and the read register asserts a fault detect signal to the BIST controller 600. The BIST controller 600 also supplies a write data signal to the write register 608, a compare address signal and a compare data signal to the compare register 612, and a control/address signal to the memory control logic 616. Further, the compare register 612 asserts a fault detect signal to the BIST controller 600 and receives the match found and match address signals from the memory 300.

The BIST controller 600 generally manages execution of the memory test by initiating memory transactions, determining the read, write, and compare words, and tracking faults which are detected during test. The BIST controller 600 loads data into the read, write and compare registers via the expected read data, write data, and compare data signals, respectively. In addition, the BIST controller 600 supplies the compare register with an expected compare address value via the compare address signals. The BIST controller 600 monitors the fault detect signals from the read register 604 and compare register 612 to determine if a fault may have occurred during a read or compare operation.

The memory control logic 616 operates the word lines, bit lines, and compare line signals that control memory transactions. As depicted in FIG. 6, the memory control logic 616 provides separate bit lines and compare lines to the memory 300, including a set of main bit lines, a set of inverted bit lines, a set of main compare lines, and a set of inverted compare lines. Accordingly, the memory control logic 616 comprises a dual port memory controller. In an alternative embodiment, the main bit lines are combined with the main compare lines, and the inverted bit lines are combined with the inverted compare lines, resulting in a single port architecture. The memory control logic 616 also controls the word lines that activate memory words in the array 300.

To write a data word to the memory, the BIST controller 600 loads the write register with the data word via the write data signals. The BIST controller 600 further supplies the word address of the write operation to the memory control logic 616, along with an instruction to perform the write operation, over the control/address signals. In response, the memory control logic 616 drives the word lines to activate the memory word corresponding to the supplied address, then transferring the data word from the write register 608 onto the main bit lines. The memory control logic 616 also drives the inverted bit lines with the complement of the data word stored in the write register 608.

To perform a read operation and to verify the data at a particular address in the memory, the BIST controller 600 loads the read register with an expected read data value, via the expected read data lines. The expected read value represents the data word that the BIST controller 600 expects to read from the memory 300, under fault free conditions. Thus, if the read value returns a data value that does not match the expected read data, a fault may have occurred in the memory 300. To initiate the read operation, the BIST controller 600 supplies the read address to the memory control logic 616, along with an instruction to perform the read operation, via the control/address signals. In response, the memory control logic 616 activates the word lines corresponding to the read address, and then transfers the read data from the bit lines to the read register 604. If the incoming read data does not match the expected read data, which is encoded on the expected read data signals (or which can be stored in the read register 604), then the read register 604 asserts the fault detect signal, notifying the BIST controller 600 that fault may have occurred. The read register 604 keeps the fault detect signal deasserted if the read data matches the value of the expected read data signal.

To perform a comparison operation, the BIST controller 600 loads a compare word into the compare register 612 via the compare data lines. The BIST controller 600 also supplies the expected compare address to the compare register 612, via the compare address lines. The expected compare address represents the values that the memory should return in response to a compare operation, via the match found and match address signals. The BIST controller 600 initiates the compare transaction via the control address/lines. In response, the memory control logic 616 drives the main compare lines with the compare word value stored in the compare register 612. The memory control logic 616 also drives the inverted compare lines with the complement of the compare word value. The compare register 612 then examines the value of the match found signal to determine if a match was returned. If the compare operation produced an address match, and if the compare address signals indicated that a match was expected, then the compare register 612 compares the match address signals with the expected match address. If the compare operation returns a match when no match is expected, or if the compare operation returns a match address that does not match the expected compare address, then the compare register 612 asserts the fault detect signal to the BIST controller 600. Otherwise, the compare register 612 keeps the fault detect signal deasserted.

The BIST controller 600 thus executes either the dual port memory test or single port memory test via the registers 604, 608, and 612 and memory control logic 616. If at least one fault detect signal is asserted during the test, either from the read register 604 or the compare register 612, then the memory 300 is considered faulty. If desired, the BIST controller 600 may count the number of times that a fault detect signal is asserted (including which of the fault detect signals is asserted) and may track the addresses at which faults occur. If neither fault detect signal is asserted during the test, then the memory is deemed fault free. Accordingly, all types of faults in the memory may be uncovered, including traditional storage cell faults, compare logic faults, and faults between the storage and compare logic. Moreover, the dual and single port tests require only 10N+2L and 12N+2L tests, respectively, to thoroughly verify the memory integrity, a significant improvement over some prior art testing algorithms.

Numerous variations and modifications will become apparent to those skilled in the art once the above disclosure is fully appreciated. Note, for example, that the memory tests may address the memory locations in any desired order during any pass, including from 0 to N−1, from N−1 to 0, or in any other order as desired. Further, the tests may bitwise address the memory, instead of accessing one word during each operation. It is intended that the following claims be interpreted to embrace all such variations and modifications.

We claim:

1. A content addressable memory test circuit, comprising:
 a memory control logic device configured to implement read, write, and compare memory transactions over word lines, bit lines, and compare lines associated with a content addressable memory array, wherein each memory transaction accesses one word of the memory array;

a read register coupling said memory control logic to said test controller, wherein said read register receives data returned from read operations over said bit lines;

a write register coupling said memory control logic to said test controller, wherein said memory control logic transfers data from said write register onto said bit lines to execute write operations;

a compare register coupling said memory control logic to said test controller, said memory control logic transferring compare words from said compare register to said compare lines to perform compare operations; and a test controller capable of initiating memory operations through said memory control logic, said operations including:

initializing each of a plurality of memory addresses within the memory array to a predetermined test word during a first test pass; and performing a plurality of operations at each memory address during a second test pass, the operations at each address including:

reading the contents of a current word address, and indicating a fault condition at the current word address if the contents of the current word address do not equal the predetermined test word;

comparing the predetermined test word to the contents of the plurality of word addresses in the memory array simultaneously, and determining the address of the first occurring match in the memory array, and indicating a fault condition if the first occurring match is not the current word address, wherein the reading and comparing steps occur concurrently;

writing the complement of the predetermined test value to the current word address; and advancing to the next sequential word address within the memory array.

2. The circuit of claim 1, wherein each bit of the test word comprises the same binary value.

3. The circuit of claim 1, wherein the second pass is performed on the word addresses starting with the lowest address and progressing to the highest address.

4. The circuit of claim 1, wherein the second pass is performed on the word addresses starting with the highest address and progressing to the lowest address.

5. The circuit of claim 1, wherein the successive compare operations that are performed during the second pass are performed using successive compare words, wherein each successive compare word comprises said one bit in a different bit position than the previous compare word.

6. A content addressable memory test circuit, comprising:

a memory control logic device configured to implement read, write, and compare memory transactions over word lines, bit lines, and compare lines associated with a content addressable memory array, wherein each memory transaction accesses one word of the memory array;

a read register coupling said memory control logic to said test controller, wherein said read register receives data returned from read operations over said bit lines;

a write register coupling said memory control logic to said test controller, wherein said memory control logic transfers data from said write register onto said bit lines to execute write operations;

a compare register coupling said memory control logic to said test controller, said memory control logic transferring compare words from said compare register to said compare lines to perform compare operations; and a test controller capable of initiating memory operations through said memory control logic, said operations including:

initializing each of a plurality of memory addresses within the memory array to a predetermined test word during a first test pass; and performing a plurality of operations at each memory address during a second test pass, the operations at each address including:

reading the contents of a current word address, and indicating a fault condition at the current word address if the contents of the current word address do not equal the predetermined test word;

comparing the predetermined test word to a compare word comprising exactly one bit that matches a bit value in the predetermined test word, and determining the address of the first occurring match in the memory array, and indicating a fault condition if the first occurring match is not the current word address, wherein the reading and comparing steps occur concurrently;

writing the complement of the predetermined test value to the current word address; and advancing to the next sequential word address within the memory array.

7. A method of testing for faults in a content addressable memory array, comprising:

(a) initializing a plurality of word addresses within the memory array to a predetermined test word;

(b) reading the contents of a current word address, and indicating a fault condition at the current word address if the contents of the current word address do not equal the predetermined test word;

(c) comparing the predetermined test word to the contents of the plurality of word addresses in the array simultaneously, and determining the address of the first occurring match in the memory array, and indicating a fault condition if the first occurring match is not the current word address, wherein step (b) and step (c) occur concurrently;

(d) writing the complement of the predetermined test value to the current word address; and (e) advancing to the next sequential word address within the memory array and repeating steps (b)–(e).

8. The method of claim 7, wherein each bit of the test word comprises the same binary value.

9. The method of claim 7, wherein the steps are performed on the word addresses starting with the lowest address and progressing to the highest address.

10. The method of claim 7, wherein the steps are performed on the word addresses starting with the highest address and progressing to the lowest address.

11. The method of claim 7, wherein successive compare operations are performed using successive compare words, wherein each successive compare word comprises said one bit in a different bit position than the previous compare word.

12. A method of testing for faults in a content addressable memory array, comprising:

(a) initializing a plurality of word addresses within the memory array to a predetermined test word;

(b) reading the contents of a current word address, and indicating a fault condition at the current word address if the contents of the current word address do not equal the predetermined test word;

(c) comparing the predetermined test word to a compare word comprising exactly one bit that matches a bit value in the predetermined test word, and determining the address of the first occurring match in the memory array, and indicating a fault condition if the first occurring match is not the current word address, wherein step (b) and step (c) occur concurrently;

(d) writing the complement of the predetermined test value to the current word address; and (e) advancing to the next sequential word address within the memory array and repeating steps (b)–(e).

* * * * *